United States Patent
Johnson et al.

(10) Patent No.: US 11,251,357 B2
(45) Date of Patent: Feb. 15, 2022

(54) ACTUATOR DEVICE BASED ON AN ELECTROACTIVE POLYMER

(71) Applicant: KONINKLIJKE PHILIPS N.V., Eindhoven (NL)

(72) Inventors: Mark Thomas Johnson, Eindhoven (NL); Anton Daan Van Den Ende, Eindhoven (NL); Eduard Gerard Marie Pelssers, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 772 days.

(21) Appl. No.: 16/068,735

(22) PCT Filed: Jan. 18, 2017

(86) PCT No.: PCT/EP2017/050919
§ 371 (c)(1),
(2) Date: Jul. 9, 2018

(87) PCT Pub. No.: WO2017/129453
PCT Pub. Date: Aug. 3, 2017

(65) Prior Publication Data
US 2019/0027673 A1 Jan. 24, 2019

(30) Foreign Application Priority Data
Jan. 25, 2016 (EP) .................................. 16152574

(51) Int. Cl.
*H01L 41/04* (2006.01)
*H01L 41/193* (2006.01)
(Continued)

(52) U.S. Cl.
CPC ............ *H01L 41/042* (2013.01); *F03G 7/005* (2013.01); *H01L 41/047* (2013.01);
(Continued)

(58) Field of Classification Search
CPC .............................. H01L 41/042; H01L 41/09
(Continued)

(56) References Cited

U.S. PATENT DOCUMENTS 5,356,500 A 10/1994 Scheinbeim et al.
6,433,459 B1 * 8/2002 Okada ................... H02N 2/067
310/316.03
(Continued)

FOREIGN PATENT DOCUMENTS

JP 2006-288003 A 10/2006
JP 2009005436 A 1/2009
(Continued)

OTHER PUBLICATIONS

Kornbluh et al. "Electroactive Polymers: An Emerging Technology for MEMS" Proceedings of SPIE, vol. 5344 2014, p. 13-27.

*Primary Examiner* — Derek J Rosenau
(74) *Attorney, Agent, or Firm* — Schott, P.C.

(57) ABSTRACT

An actuator device (21) comprises an electroactive polymer (EAP) and a driver (20) for generating a electrical drive signals which give opposite polarity voltages and thus electrical field within the electroactive polymer at different times. In this way, charge build-up can be reduced or avoided, while prolonged activation times are still possible. This improves the performance and/or lifetime of the device.

20 Claims, 11 Drawing Sheets

(51) Int. Cl.
*F03G 7/00* (2006.01)
*H01L 41/047* (2006.01)
*H01L 41/09* (2006.01)

(52) U.S. Cl.
CPC ........ *H01L 41/193* (2013.01); *H01L 41/0906* (2013.01); *H01L 41/0926* (2013.01)

(58) Field of Classification Search
USPC .................................................. 310/317, 328
See application file for complete search history.

(56) References Cited

U.S. PATENT DOCUMENTS

| | | |
|---|---|---|
| 6,940,211 B2 | 9/2005 | Pelrine et al. |
| 7,259,503 B2 | 8/2007 | Pei et al. |
| 7,608,989 B2 * | 10/2009 | Heydt .................... H04R 19/02 310/317 |
| 2002/0195326 A1 | 12/2002 | Hunter et al. |
| 2010/0007704 A1 * | 1/2010 | Nitta .................... B41J 2/0452 347/68 |
| 2010/0079032 A1 | 4/2010 | Suzuki |
| 2011/0133676 A1 | 6/2011 | Kushima et al. |
| 2014/0084751 A1 * | 3/2014 | Suzuki .................. H02N 2/025 310/317 |

FOREIGN PATENT DOCUMENTS

| | | |
|---|---|---|
| JP | 2009-077578 A | 4/2009 |
| JP | 2013-247740 A | 12/2013 |
| RU | 2568944 C2 | 11/2015 |
| WO | 9835529 A2 | 8/1998 |
| WO | 2014148017 A1 | 9/2014 |

* cited by examiner

ACTUATOR DEVICE BASED ON AN ELECTROACTIVE POLYMER

CROSS-REFERENCE TO PRIOR APPLICATIONS

This application is the U.S. National Phase application under 35 U.S.C. § 371 of International Application No. PCT/EP2017/050919, filed on Jan. 18, 2017, which claims the benefit of EP Patent Application No. EP 16152574.6, filed on Jan. 25, 2016. These applications are hereby incorporated by reference herein.

FIELD OF THE INVENTION

This invention relates to actuator devices which make use of electroactive polymers and methods for operating such actuator devices.

BACKGROUND OF THE INVENTION

In actuator devices of which the actuation is based on electrical stimulation of electroactive polymer (EAPs), the actuation is caused by a change in size and/or shape of the EAP material when such stimulation takes place. EAPs combine a number of advantageous properties when it comes to their application for actuators. While they can work as mechanical actuators with good mechanical actuation properties, by virtue of their organic polymeric nature, they also can be easily manufactured into various shapes allowing easy integration into a large variety of systems. Materials have been developed with relatively high actuation stress and strain. Technology risks have been reduced to acceptable levels for product development so that EAPs are commercially and technically becoming of increasing interest. Advantages of EAPs include low power, small form factor, flexibility, noiseless operation, operational accuracy, the possibility of high resolution, fast response times, and cyclic actuation.

As an example of EAP device operation, FIGS. 1 and 2 show two possible operating modes for an EAP based device. The device comprises an EAP layer 14 sandwiched between electrodes 10, 12 attached to opposite sides of the EAP layer 14. While in FIG. 1 the EAP layer including electrodes is freely moveable, in FIG. 2 the whole EAP layer and its electrodes are clamped (attached) with one layer side to a support carrier layer 16. A drive signal in the form of a voltage difference applied over the electrodes 10 and 12 is used to cause the EAP layer to contract in its thickness direction to thereby expand in the lateral directions. With dielectric elastomeric EAPs this is due to contractive force applied by electrodes to the EAP layer causing layer thinning, while piezoelectric and/or electrostrictive EAPs can also function (contract) via direct coupling with the electric field thus not needing contact of the electrodes to provide a contracting force. While in FIG. 1 this leads to symmetrical deformation in the form of expansion in the indicated directions accompanied by layer thinning (lateral expansion with thinning) of the EAP layer due to the layer being freely suspended, the same actuation in FIG. 2 leads to bending of the device due to the restrained freedom of motion by the clamping on one side. Using device engineering a vast variety of device outputs can thus be invoked upon actuation of the EAP layer, i.e upon driving of the device. Thus, to obtain the asymmetric curving around an axis as shown, molecular orientation (film stretching) may for example be applied, forcing the movement in one direction. The bending may result from the asymmetry in the EAP polymer, or it may result from asymmetry in the properties of the carrier layer, or a combination of both.

SUMMARY OF THE INVENTION

The inventors have found that for EAP based actuators, when used in applications that require actuation for prolonged and/or frequent periods of time, the actuation is not constant over time and/or that the drive versus actuation curve of different subsequent actuation periods of a device changes over time. This hampers practical application of the actuators.

There is therefore a need for an improved actuator and a method of operating such actuator to reduce or remove the aforementioned problems.

This object is achieved at least partly with the invention as defined by the independent claims. The dependent claims provide advantageous embodiments.

According to the invention there is thus provided an actuation method and an actuation device for using the actuation method where periodic inversion of the polarity of the driving or actuation signal within one actuation event (single continuous actuation) and/or for subsequent actuation events (multiple continuous actuation events separated by at least a rest period) is employed.

With the periodic inversion is meant that drive signals can be, or are, provided to the EAP structure that cause the "opposite polarity" voltage difference across the EAP so that the electric field in the EAP can be made to have an opposite direction through the material at different periods of actuation and/or at different actuation events. The first polarity can be positive so that the second polarity is a negative or vice versa. The polarity of the voltage difference between the electrodes defines the direction of electric field applied to at least part of the EAP material of the EAP structure. That fact that such inversion driving as defined by the invention can be used to reduce the aforementioned problems, is based on the inventors recognition that:

- An EAP actuators often require a large electric field of the order of tens of Volts per micron EAP layer thickness in order to drive/actuate them and these high actuation fields are a cause for several interfering processes such as e.g. field dependent charge transportation and polymer structure relaxation effects to occur next to that of the actual driving/actuation.
- The actuation of the EAP actuator responds only to the magnitude of the field (related to Voltage difference level) and not its direction, while many if not all of the interfering processes causing the above mentioned discovered problems are dependent on both the field magnitude and field direction. This difference is used to advantage with the invention to reduce or remove the effects of the interfering processes Thus, while the invention specifies to reverse voltage polarities during or between driving, at the same time, the actuation of the EAP structure has a direction of actuation that is independent of the polarity of the voltage difference. After all, as already indicated herein above, the actuation only depends on the magnitude of the field and not the direction of the field (determined by the polarity). The invention works well for devices that show symmetric actuation behaviour, that is, actuation in the same direction for different voltage polarity drive signals provided to the same electrodes.

Thus, with the invention, the effects of motion of charged or dipolar species and/or (re)-orientation of (polar) species (molecules or molecular parts) within the actuator, and especially the EAP, that are caused and driven by the electric field across the actuator can be reduced or prevented. The build-up of (semi-permanent) charged species layers or polarized species layers may influence (e.g. cause a higher voltage required to achieve the same actuation) the actuator device operation by increasingly shielding the applied actuation field and this can be reduced or even prevented with the invention. Also the effect of having an unintentional actuation at rest state of the actuator (e.g. at non-actuation drive signal application or differently stated, without the application of an actuation signal) caused by the build-up of semi-permanent charged species or re-orientation of EAP molecules, ions or other species can be reduced or prevented. Furthermore, the effect of aging and electrical breakdown of the actuator caused by mechanical motion and wear, accumulation and trapping of charged species possibly at defect sites may be reduced or prevented. Importantly, one or more of the above advantages can be at least partly achieved without compromising the required actuation of a device.

Within the context of the invention, the electrical drive signal can be a voltage signal (voltage driving) having voltage signal levels or a current signal with current signal levels (current driven). The current signal will be accompanied by associated voltage differences across the electrodes. When provided to the electrode arrangement, the electrical drive signal causes voltage differences between the electrodes of the electrode arrangement, which in turn cause an electric field over at least part of the EAP. By definition, for an electrical drive signal causing voltage differences over the electrodes having only positive or only negative voltages (with respect to one reference), the drive signal and related voltage differences are defined to be unipolar. Likewise, for a drive signal causing voltage differences of opposite polarity, the drive signal and related voltage differences are defined to be bipolar. A drive signal and voltage difference of 0 V is defined to have no polarity, as it is neither positive nor negative.

The electrical drive signal comprises a first electrical drive signal that causes a first voltage polarity (e.g. positive with regard to one of the electrodes) in a first time period and a second electrical drive signal that causes a second voltage polarity (e.g. negative with regard to the same one of the electrodes) in a second time period. The drive signal of the current invention is thus such that the voltage differences over the electrodes is bipolar during an actuation event or period and/or during a plurality of subsequent actuation events during a time period of operation or during at least part of the actuation lifetime of the device. Thus, by full or partial inversion of the driving signal some or all of the negative effects of the disturbing aforementioned mechanisms can be addressed.

The actuator comprises an EAP structure that defines a non-actuated state and at least one actuated state (different from the non-actuated state) attainable by application of an electrical drive signal to the EAP structure. The actuated state provides an actuation in the form of a mechanical actuation which can be a force (pressure) and/or stroke provided by the structure due to propensity of the EAP structure to deform upon application of the drive signal.

The electrical drive signal is provided to the EAP structure with an electrode arrangement having one or more electrodes for applying the drive signal to. The electrodes can be segmented. The EAP material may be between (e.g. sandwiched between) electrodes of the electrode structure. Alternatively, electrodes can be on a same side of the EAP material. In either case, electrodes can be physically attached to the EAP material either directly without any (passive) layers in between, or indirectly with additional (passive) layers in between. But this need not always be the case. For example for relaxor or permanent piezoelectric or ferroelectric EAPs, direct mechanical contact with electrodes is not necessary. In these cases electrodes in the vicinity of the EAPs suffice as long as the electrodes can provide an electric field to the EAPs. However, for dielectric elastomers as EAPs, the electrodes need to be in physical contact (such as e.g. attached to) the EAP material such that an electric field applied to the electrodes can impose a force to the EAP that makes the EAP deform. Thus, the electrodes can be part of the electroactive polymer structure.

In the invention an absolute value of an integral of the voltage difference over a predetermined time interval and an absolute value of an integral of the voltage difference over the second period can be the same. Hence electric field strength is kept the same during first and second periods. The same can mean within a deviation less than 10%, less than 5% but preferably less than 1%. In the device, the driver may thus be adapted to generate or switch electrical drive signals such that the electric field with one polarity (voltage with one polarity) has the same electric field strength integrated over time as the electric field with the opposite polarity (voltage with other polarity). This means the overall electric field over time is made the same for the two polarities to minimize long term charge imbalance. The same In this way, an overall neutral movement of charges, dipoles and other defects in the EAP may be achieved.

In the invention the first period and/or the second period can be longer than a time period chosen from the group consisting of: 10 milliseconds, 50 milliseconds, 0.1 second, 0.5 second, 1 second, 5 second, 10 seconds, 50 seconds. Especially for such longer actuations the invention will have a good effect. To limit operating voltages of EAP structures, their dimensions (e.g. thickness) between the electrodes has a preferred upper limit. Preferably, the polarity reversal may then be based on the timescale with which charges migrate across the EAP layer of a defined dimension between the electrodes. Thus, in the invention the first period and/or second period are in the range of 10 milliseconds to 10 seconds. Hence, charge in the EAP layer cannot get completely across from one electrode to another to give complete charge separation with such period and this facilitates compensation with the opposite polarity voltage difference signal.

In the invention, the first period and the second period can be equally long and/or the absolute value of the voltage difference in the first period and the absolute value of the voltage difference in the second period can be both constant and the same. Hence, duty cycle for both polarity pulses is made more similar or even the same and only the number of pulses of each polarity need be balanced to give good compensation effect. This effect is even better when the electric field with one polarity has the same electric field strength as the electric field with the opposite polarity. In this way, the same actuation of the EAP in both polarities may be achieved. The latter feature also has the effect that vibrations induced by the inversion driving scheme can be more limited since the actuation strength is the same.

A method as claimed in any of the previous claims, wherein the voltage difference during the first period is constant and the voltage difference during the second period is constant. In this case only the duration in the form of first period and second period or number of first periods per second period need be adjusted to optimize balance of positive and negative polarity pulses for compensation.

In the invention, the first and/or the second electrical signal each can have multiple different signal levels to define multiple different voltage differences. Thus, the driver may be adapted to generate, for each polarity, a single level signal or a multi-level signal. A multi-level drive signal may be used to enable the actuator to be driven to intermediate states. This allows more complicated signal use for actuations. Preferably, the shape of a curve of the absolute value of the voltage difference over time within the first period is the same as the shape of a curve of the absolute value of the voltage difference over time within the second period. The latter allows use of different signal levels, but controlled compensation through pairing of signals that give same electrical signal exposure during opposite polarity voltage differences.

To accomplish the above methods of driving, the driver may be adapted to generate and/or switch the electrical drive signals, first and second electrical drive signals accordingly. Hence a device having a driver adapted to achieve the method features will have the same benefits as described in association with one or more of the method features.

In the invention, the actuation preferably is a continuous actuation within a drive period, where the drive period comprises or consists of one or more of the first periods and one or more of the second periods. The continuous actuation is a single actuation event. Thus, the electrical drive signals are designed to comprise at least a first electrical drive signal and a second electrical drive signal within the drive period of the continuous actuation. In this way, the electrical drive signal for a single actuation can become self-compensating. Thus any charge imbalance in the EAP material induced by the first electrical signal of the actuation can be compensated by the second electrical drive signal within the drive period Any next single actuation thus starts from a compensated situation. The compensation can be done in the previously described ways of defining the first and or second electrical signals. Thus, this means that there can be close to no charge separation at the end of each actuation cycle. The number of phases of each polarity within the single actuation cycle may be equal.

In the invention applied to a single actuation event, the first electrical drive signal and the second electrical drive signal preferably follow each other such that upon changing from a first electrical drive signal to a second electrical drive signal or vice versa, the actuation does not change by more than a value chosen from the group consisting of: 50%, 20%, 10%, 5%, 2% 1%, and 0%. The faster the switching from the first electrical signal to the second electrical signal or vice versa, the less change of actuation state will generally be caused. Hence, actuation can remain more accurate during compensation and vibrations can be minimized.

In the invention applied to a single actuation event, the drive signal can comprise a first plurality of first electrical drive signals and a second plurality of second electrical drive signals, the first and second plurality of drive signals together forming an alternating signal with first electrical drive signals and second electrical drive signals alternating in time. Thus, there is an alternating signal within the drive period. Thus, EAPs can be driven to a stable actuation state with alternating signal driving giving compensation. The number of alternations per drive period is preferably as high as possible. It may for example be equal to or greater than: 5, 10, 50, 100, 500, 1000, 5000, 10000. The frequency of switching may be higher than the mechanical relaxation of the EAP structure (with or without electrodes). As typical EAP actuators can be mechanically actuated from static to quasistatic up to kHz range (although at limited amplitude), suitable drive signal inversion frequencies will be at least 2 times this frequency and more preferably even higher (e.g. 5, 10, 50, 100 or even 500 times higher).

In the invention applied to multiple separate actuation events, the actuation can comprise a first continuous actuation and a second continuous actuation mutually separated by at least a rest period, and wherein the first electrical drive signal (which occurs in the first period) contributes to the first continuous actuation and the second electrical drive signal (which occurs in the second period) contributes to the second continuous actuation. Again, with a continuous actuation is meant a single actuation event, i.e one that at least does not revert to zero actuation during any period. The rest period is a period of no actuation.

In the invention, for a plurality of first continuous actuations and a plurality of second continuous actuations, one or a plurality of first electrical drive signals is followed by one, or a plurality of second drive signals and/or vice versa. The plurality of first electrical drive signals can be a predetermined number. In this way the polarity is thus switched after a plurality of first or second electrical signals. At the limit, there may be only one switch in polarity during the lifetime of the device. Or, more preferably the polarity is switched more frequently, for example after each continuous actuation (signal). In this way, the charge build-up is reduced, since a polarity change is effected each time the device is addresses with a control signal.

In the invention the method can comprise:
determining for one or more first electrical drive signals within a predetermined time interval one or more of the following characteristics:
their number;
one or more signal levels
one or more first drive periods;
one or more integrals of the voltage difference over time;
dependent on one or more of the determined characteristics, adjust one or more of the same characteristics for one or more second electrical drive signals following the predetermined time interval.

Thus active definition of future signals at any one point in time for improved compensation can be based on feedback of historic actuations. Hence compensation can be done even when varying actuations for varying situations are needed. This facilitates application of the invention to many devices. The device can have a computer and memory for storing one or more of the above historic actuation data.

A computer program product comprising computer readable code stored on, or storable on a computer readable medium, or downloadable from a communications network, which code, when executed on a computer, can cause or causes execution of the steps of any one of the methods as claimed in claims 1 to 12. The method of the invention can be implemented in software that is capable of controlling a driver of an actuation device to make the actuation devices' EAP structure behave as desired.

As said, the invention can be implemented in an actuator device comprising:
an electrode arrangement (10 and 12) comprising a first electrode (10) and a second electrode (12), the electrode arrangement being for receiving an electrical drive signal to therewith cause a voltage difference between the first electrode and the second electrode;
an electroactive polymer structure (14) for providing an actuation in response to the voltage difference;

a driver (20) for applying the electrical drive signal to the electrode wherein the electrical drive signal comprises:
- a first electrical drive signal during a first period for causing the voltage difference to have a first polarity in the first period; and
- a second electrical drive signal in a second period, different from the first period, for causing the voltage difference to have a second polarity, different from the first polarity, in the second period. This device is advantageous because it can perform the method of the invention. The driver of the device is configured to provide all of the electrical drive signals as defined herein before. Hence, all features of the method steps can be used to define the driver of the device. Also, this device will have a more accurate actuation and/or longer lifetime as negative material deteriorating effects are compensated.

In the device of the invention the driver can be for switching the electrical drive signal from a first electrical drive signal to a second electrical drive signal or vice versa at least once within a continuous actuation drive period. Again as for the corresponding method claim this means that there can be close to no charge separation at the end of each actuation cycle. This offers very much improved freedom of use as compensation can occur within every separate actuation event regardless of such actuation events being the same or different. The number of phases of each polarity within the single actuation cycle may be equal.

In the device of the invention at least the first electrode can comprise two separate electrode segments, and the driver is for providing separate ones of the electrical drive signals, the separate electrode segments being arranged for receiving the separate ones of the electrical drive signals and to cause the voltage difference at different portions of the electroactive polymer structure. Separate electrode segments can thus be individually addressable. With such a device, actuation of the EAP structure is divided over different portions of the EAP structure and differentiating switching between the portions can be used to minimize the distortions introduced with switching. The separate ones of the electrical drive signals need not be identical, but in many cases are. In any case they must be provided to the electrodes such that at least one first period of one of the separate signals partly or entirely overlaps in time with one second period of the other of the separate signals. Thus, the electrode arrangement may comprise at least two segments, each for applying an electric field to a different portion of the electroactive polymer layer, wherein the driver is adapted to apply opposite polarity signals to the at least two segments. This approach may reduce undesired deformation changes which result from the switching within the single actuation event drive signal, which may thus be an alternating signal.

In the invention for a continuous actuation event, the electrode arrangement and the electroactive polymer structure encompass an actuation unit, wherein the device comprises at least two separate ones of actuation units each contributing its actuation to the same actuation output of the device and the driver is for providing separate ones of the electrical drive signals to the different ones of the at least two separate actuation units. The separate ones of the actuation units can be identical or not. They may both be bending actuation units, or linear expansion actuation units or a mix of them. There may be more than two of such units. The separate ones of the electrical drive signals again may give out of phase driving and/or switching as described for the segmented electrode device. Hence during switching of one of the units, the reduction or loss of its actuation output may be taken over or compensated by the output of the other unit such that the single device output is minimally affected.

In the multiple segment or multiple actuation unit devices, the driver can be for providing the different ones of the electrical drive signals such that the switching from the first electrical drive signal to the second electrical drive signal for the different ones of the electrical drive signals is out of phase. If the moment of change of first electrical drive period to second electrical drive period or vice versa is different for the different segments or actuation units, then actuation stabilization is improved upon such switching.

The driver can be for switching a first electrical drive signal to a second electrical drive signal or vice versa between continuous actuation drive periods and:
- after one or more first electrical drive signals, and/or
- after one or more second electrical drive signals.

In one example, the driver is adapted to switch polarity after a plurality of first electrical drive signals and/or after a plurality of second electrical drive signals. At the limit, there may be only one switch in polarity during the lifetime of the device. More preferably, the driver is adapted to switch polarity more frequently, for example after each continuous actuation (signal). In this way, the charge build-up is reduced, since a polarity change is effected each time the device is addresses with a control signal.

The driver can comprise:
- an electrical power source for generating electrical signals of the first polarity and of the second polarity for use in the electrical drive signal; or
- an electrical power source for generating electrical signals of at least the first polarity or at least the second polarity for use in the electrical drive signal and a switching arrangement for switching the coupling of the electrical drive signal to the electrode arrangement. With the switching of the coupling, the switching from the first polarity to the second polarity or vice versa can be achieved.

The driver may comprise a signal generator for generating opposite polarity signals. Alternatively, the driver may comprise a signal generator for generating single polarity signals and a switching arrangement for coupling the driver output to the electrode arrangement. These provide alternative ways to provide opposite polarity signals to the EAP layer. A simplified and cheaper signal generator can be used when the switching unit is employed.

The device of the invention can comprise a processor and a memory, the memory having stored therein the computer program product of the invention and the processor for executing the computer program product to control the driver. The processor can be a semiconductor processor such as a central processing unit etc. The memory can be a RAM or ROM memory of any kind which can be accessed by the processor.

Measures for modification as described for the system or device can be used to modify the corresponding method. Such modification can have the same advantages as described for the system or device claimed or described.

BRIEF DESCRIPTION OF THE DRAWINGS

Examples of the invention will now be described in detail with reference to the accompanying schematic drawings, in which like numerals represent the same features and in which.

DETAILED DESCRIPTION OF THE EMBODIMENTS

Figure 1:
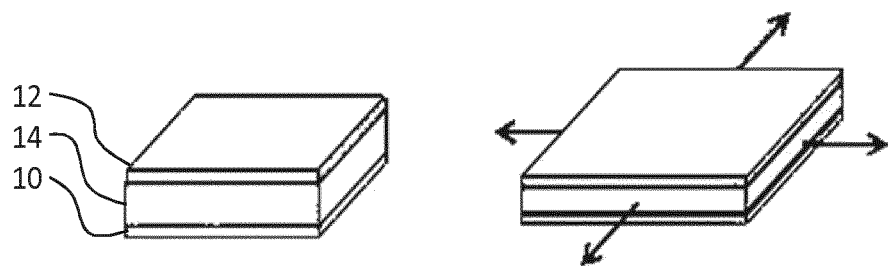
FIG. 1 shows a known electroactive polymer structure which is not clamped for linear actuation in plane.

The invention involves inverting the direction of the applied electric field over the EAP by means of inverting the voltage difference over the electrodes (changing the polarity of the voltage) to which drive signals are applied, where the electrodes are arranged to be able to provide an electric field over at least a part of the electroactive polymer structure. The inverting occurs at least once during the operational lifetime of the device. At the limit, there is only one voltage polarity change mid-way through the life of the device. Preferably, for a more practical implementation of the invention, the inversion is performed multiple times during the lifetime of the device. Such may be done at regular time intervals during the lifetime of the device, or within a certain (predetermined or driving history feedback based) period of time or actuation cycle of the device. The inversions can be done between separate actuation events and/or within an actuation event. The number of inversions and drive signals needed for a particular device will depend on the drift behavior of the drive-actuation output curve of the device as well as the actuation circumstances during use of a device. The driving can be tuned to the device. This could require driving the device with a unipolar (one single polarity voltage difference) drive signal scheme in order to observe the drift characteristics and then adjust and tune the driving by using a bipolar (using different polarity voltage differences) drive scheme according to the invention. The tuning then occurs such that the bipolar drive scheme provides a desired mechanical actuation as could be obtained with the unipolar drive signal scheme, but with reduced or even absent drift of the drive-actuation curve. The calibration can be stored in a lookup table to be employed during actual use of the device. Many bipolar drive signal schemes according to the invention can be used, but only some of them will be described herein below to explain the invention in more detail. The drivers for providing the drive signals and drive schemes can be voltage drivers or current drivers, as long as they are suitable to provide the electric fields (through voltage differences) in EAPs of choice. A number of suitable EAPs will also be described herein below.

The invention is applicable to actuator devices that have an electroactive polymer structure including an EAP material, where the structure is capable of providing a mechanical actuation upon subjection of at least part of the EAP material to an electrical drive signal. The mechanical actuation is based on the EAP being capable of causing the structure to deform when the electrical drive signal is applied. Many different of such structures and devices can be devised, but only some exemplifying ones will be described herein below. Nevertheless, the invention can be applied to all EAP based actuators or other polymer actuators with are driven using voltages and which show similar relaxation effects.

Figure 2:
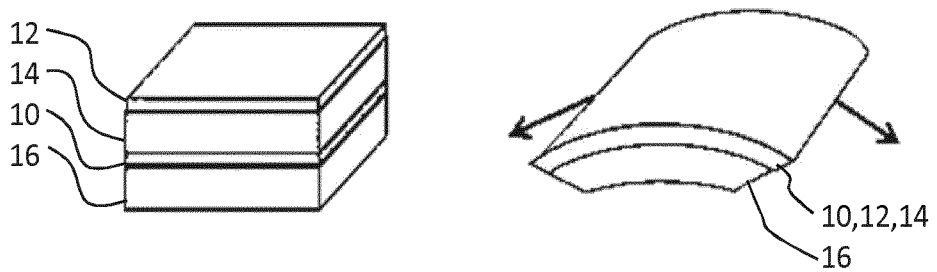
FIG. 2 shows a known electroactive polymer structure which is constrained by a backing (carrier) layer for bending actuation.

FIGS. 1 and 2 show exemplifying EAP based actuator structures that can be used in actuator devices according to the invention. An exemplifying actuator device including a driver is depicted in FIG. 3.

Figure 3:
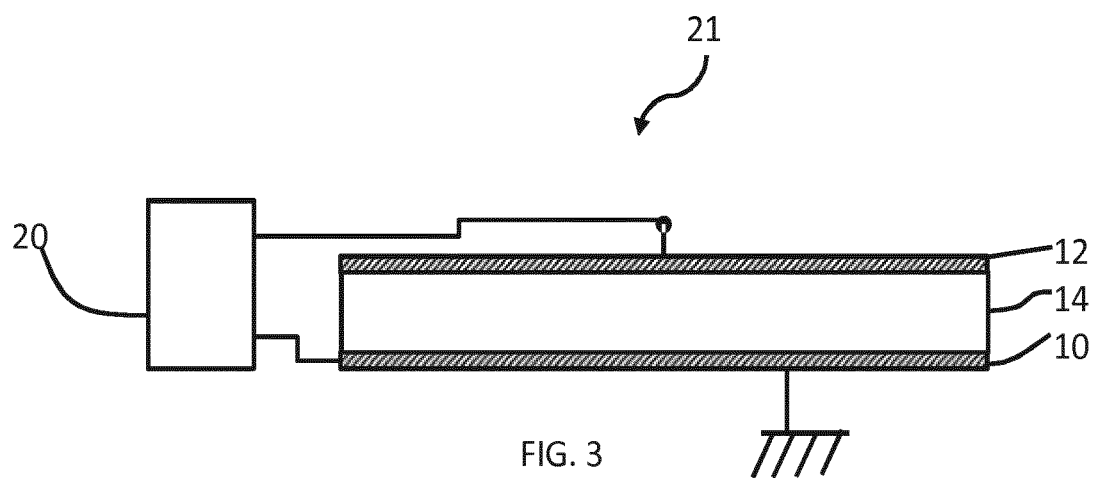
FIG. 3 shows a basic layout of an actuator device including a driver connection.

While the structures of FIGS. 1 and 2 have been described in the introduction of this application, FIG. 3 shows a device having an actuation structure in the form of an EAP layer 14 of constant thickness across the structure sandwiched between electrodes 10 and 12 attached to the EAP layer 14. It can be any one of the structures of FIGS. 1 and 2, or any other if needed. In this case the electrode arrangement is part of and attached to the EAP structure, but that need not always be the case. The EAP in this case is a dielectric elastomeric polymer. The electrode 10 is grounded (at zero potential or voltage) for a reference and the electrode 12 is connected to an output from a driver 20 which is capable of providing an electrical drive signal in the form of varying, variable or adjustable voltage levels during predefined or adjustable time periods. The ground connection can be a general separate ground connection (not shown), but in this case is supplied by another output of the driver which in turn is connected internally to a common ground (e.g. of socket). The driver 20 may, and in this case includes a voltage source (not separately shown) or voltage signal generator that is capable of providing positive (e.g. first polarity) and negative (e.g. second polarity) voltage signals. Alternatively a separate voltage source can be used and connected to the driver. The driver contains a switching unit either internally as shown, or externally for using voltages of the voltage source in order to generate the electrical driving signals to be applied to the electrode arrangement.

The driver is adapted to apply drive signals with bipolar voltage levels to the electrode 12 such that the voltage levels together with the ground signal define voltage differences with associated positive (first polarity) or negative (second polarity) polarities (and hence electric field directions) between the electrodes. Either the electrode 12 or 10 can be used as a reference to determine the sign of polarities (direction of electric field). In this case polarities are determined with respect to the grounded electrode as a difference between signal on electrode 12 and ground signal. Any other reference voltage can also be used as long as the voltage levels of the drive signal are then adjusted such that the voltage difference comprises positive and negative voltage differences with respect to e.g. the reference electrode.

It will be appreciated by those skilled in the art that the voltage differences can also be generated by using drive signals supplied to both electrodes, again, as long as they are composed such that the voltage differences caused change polarity with regard to one chosen reference electrode according to the requirements of the invention (at least once during the actuation lifetime of the device) as exemplified herein below.

FIGS. 4 and 5 show electrical driving signals according to the invention for two situations. Although others exist, they serve to explain the general application of the invention. FIGS. 4A to E are used to explain how the invention can be used for multiple subsequent separate actuations with a rest period (being a period without any actuation) in between, while FIGS. 5A to D serve to explain the implementation of the invention within one and the same actuation.

In FIG. 4, the electrical drive signal (or also referred to as waveform) 40 includes a positive voltage signal/pulse 45 (first electrical drive signal) within a first period 41 followed by a second negative voltage signal/pulse 46 (second electrical drive signal) within a second period 43. These pulses define separate actuation events and there is thus a rest period 47 between them with zero voltage. So in the electrical drive signal 40 there are two independent actuations using a bipolar voltage scheme. The rest period can be long or short, even as short as zero time. There may be other events between pulses 45 and 46 but these are not shown for clarity. For sake of explanation and an optimum effect of the invention it is assumed that both pulses 45 and 46 are identical with respect to absolute value of the voltage level and first and second period, but this need not be the case for the invention to have at least some improving effect.

The pulse 45 will cause a certain mechanical actuation (a continuous actuation) within the first period 41 (the mechanical actuation output is not shown for clarity). This means that within the period 41 the EAP structure's actuation state may vary, but does not revert to zero actuation state. Only after pulse 45, the actuator structure relaxes back to its non-actuated state or rest state to be ready to undergo the second actuation with pulse 46.

In prior art methods, after such relaxation to zero actuation state, a second similar mechanical actuation would be achieved by applying a second pulse 45 causing the same voltage polarity difference as the first one. This leads to accumulative drift of the drive-actuation curve. This is further explained with reference to FIG. 7.

According to a first implementation of the invention, the second actuation is now achieved in that after the first pulse 45, the polarity of the drive signal is reversed and pulse 46 is applied to the device. Note that although the voltage has different polarities, the actuation will be in the same direction as the actuation is only dependent on the magnitude of the Voltage (Field) and not the polarity (direction of the field). Thus, the pulse 46 will lead to the same actuation as obtained with pulse 45, but with a pulse that will counteract disturbing effects caused by the pulse 45 as described hereinbefore. Hence after the dual pulse drive signal of FIG. 4A, the drive-actuation curve will show less drift than with a prior art dual pulse drive signal composed of two consecutive identical polarity pulses.

An actuator may thus be operated using drive signals where for each actuation event (continuous actuation) one uses a drive signal with opposite polarity.

The amount of compensation of drift is dependent on a number of parameters among which are for example voltage levels used, drive periods used, number and repetition rates of pulses used etc. These can all be adjusted to match practical situations requiring different actuation schemes. The adjustments can be done in a predetermined way (using e.g. calibration as described herein before) or by using a feedback mechanism making use of historic driving data of these parameters. Some options to do this effectively will be described below.

Without wanting to be bound by theory, one important first order disturbing material effect may be due to charge or dipolar motion inside the EAP structure under influence of the applied electric field (voltage drive signal applied over given thickness EAP layer). As the speed of such motions is given by the (charge/dipolar mobility)×(electric field), the inversion time (time after which inversion of voltage difference polarity is needed) should decrease as the electric field increases. This translates into a situation where, after a pulse with high voltage level and a first duration, should follow a pulse with lower voltage level but longer duration or vice versa to compensate.

For typical EAP polymers, the electron mobility is typically between $1e^{-11}$ m$^2$/Vs and $1e$-13 m$^2$Ns and the electric field typically between 10V/μm and 150V/μm. The preferred inversion times will then be of the order of 1 second (for example in the range 10 milliseconds to 10 seconds) for compensating first order mobility effects.

Mobile charges are also trapped at impurities in the EAP materials and crystallite surfaces as for example in PVDF containing polymers, leading to restricted mobility and charge build-up at trapping sites. Charges accumulated at these trap sites could lead to premature electrical breakdown due to high concentrations at these sites. Also charges trapped at these sites remain relatively stable, even after the field is removed, therefore facilitating build-up over a repeated number of discrete actuations. If the polarity is reversed the deeply trapped charges are forced to recombine, which relieves the polymer from excessive build-up over longer timescales.

Inversion driving is also effective at longer timescales such as minutes or hours (as for DC driven actuators). It will be evident from this that some kind of balancing of the opposite polarity pulses with respect to signal levels, and/or signal durations and/or number of repetitions can then be done in many ways and will have an improving effect.

Returning to the examples of FIG. 4 the following variations can be used to advantage. Thus, the driver can switch the pulse polarity after each separate actuation event so that a pulse 45 is always followed by a pulse 46 or vice versa with no other actuation events in between. The drive signal 42 of FIG. 4B shows such a train or sequence of pulses (actuations) with alternating first 45 and second 46 electrical drive signals to implement the invention. Rest periods such as 47 between actuation events (pulses) are present but not indicated for clarity.

Figure 4A:
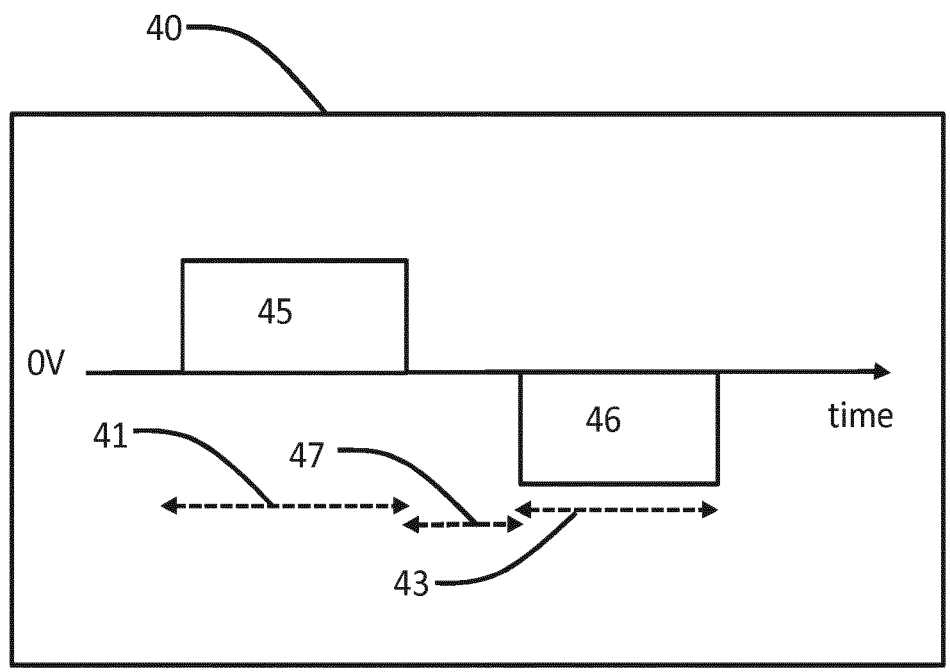
FIG. 4A to 4E show drive schemes with voltage difference or signal inversion between individual actuation events.
Figure 4B:
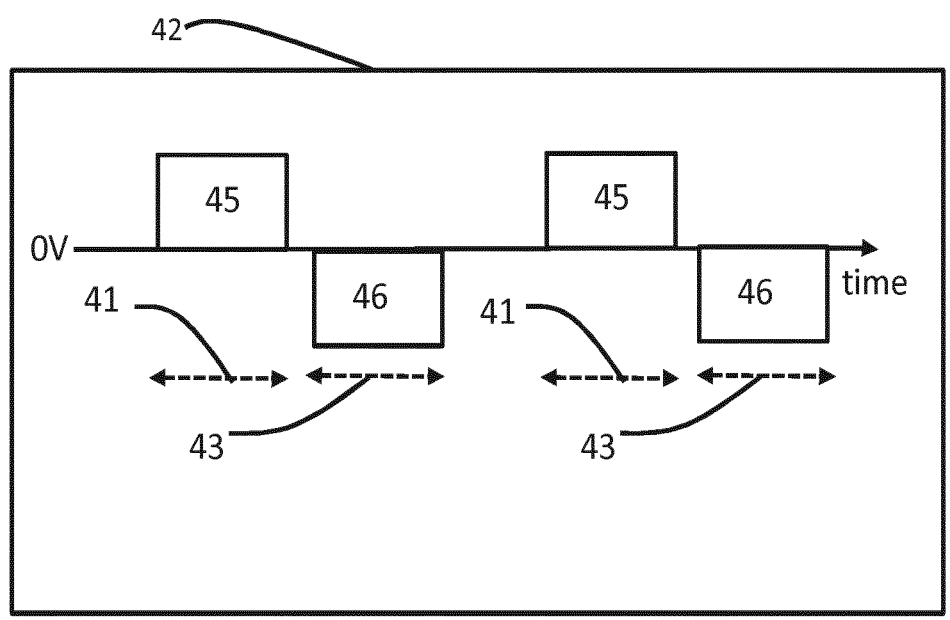
Figure 4C:
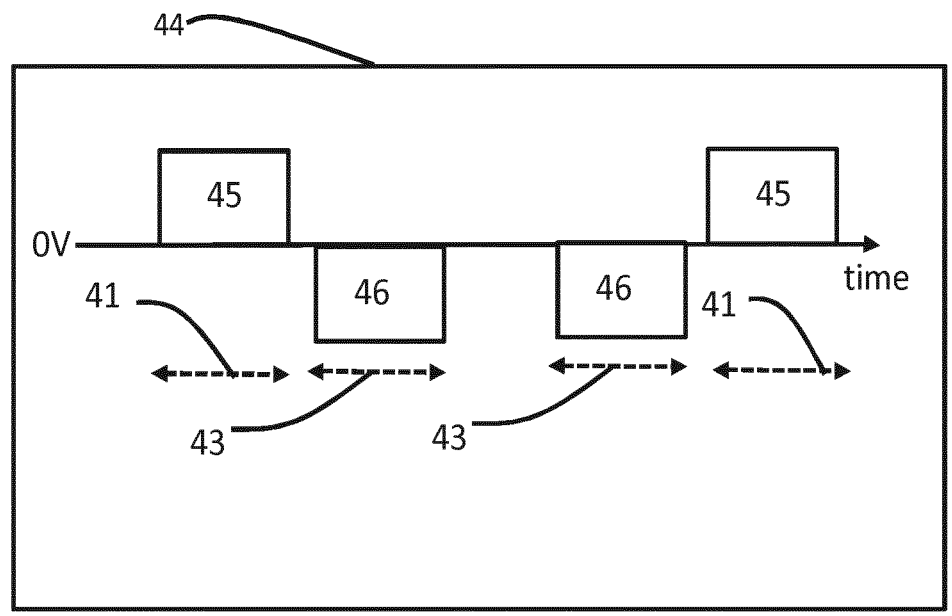

Alternatively, the driver can switch the drive signal such that voltage polarity is reversed after a multiple of same polarity voltage signals 46 such as with drive signal 44 of FIG. 4C. The polarity is switched after 2 pulses 46. Again any rest periods between actuations have been omitted for clarity.

Figure 4D:
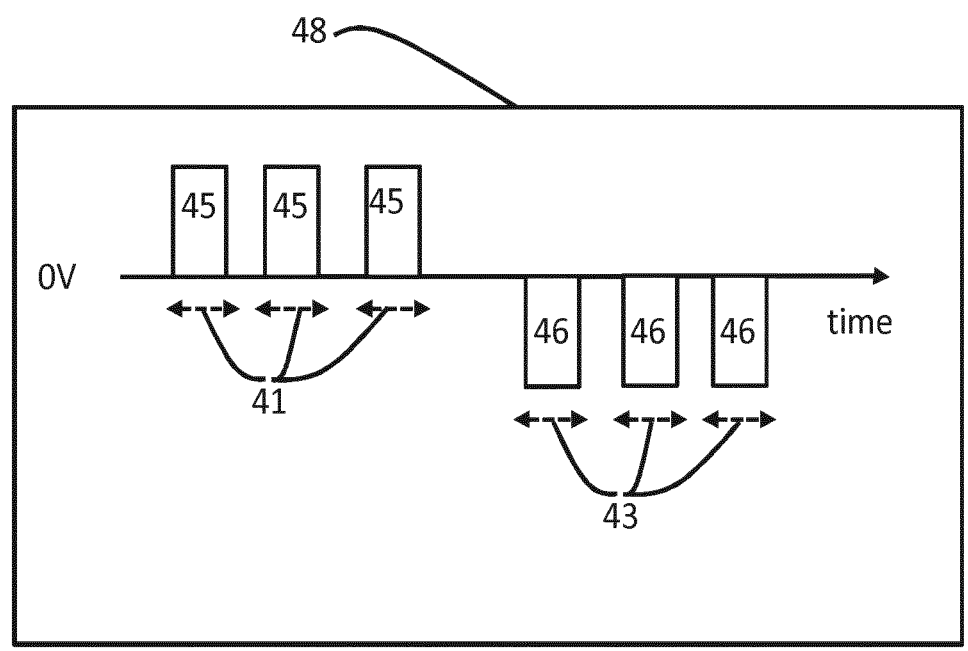

Another sequence of actuations from a drive signal 48 is shown in FIG. 4D with 3 pulses (3 actuations) 45 followed by 3 pulses (3 actuations) 46. Again any rest periods between actuations have been omitted for clarity.

Although the sequence of pulses in schemes 42, 44 and 48 is different, the compensation effects will be comparable or even identical as the number of pulses 45 and 46 is the same. This may be especially so if the pulses 45 and 46 are identical apart from their sign.

In the above examples pulses were assumed to have same duration (period 41 or period 43) and magnitude (absolute value). Thus in that case pairing pulses 46 and 45 within any one sequence of pulses will give a good balance to reduce the disadvantageous charging/relaxation effects. Preferably pairing is done with consecutive pulses 45 and 46 like in the above described drive signals. FIG. 4D shows a drive signal 48 with pairing of pulses only per three similar consecutive pulses 45 or 46.

Thus, although the waveforms of FIGS. 4A to 4D show different number of polarity inversions (1 in FIGS. 4A and 4D, 3 in FIG. 4B and 2 in FIG. 4C), the second two inversions in waveform 44 have switched order so that over the entire time period of the waveforms there are as many pulses 45 as there are pulses 46.

Balancing the number of positive pulses with those of the negative pulses is thus advantageous for reducing the charging relaxation effects. Again pulse are drawn to have same magnitudes and time duration, but these can differ.

The sequences in all of the waveforms 40, 42 44 and 48 can be repeated or changed reversed etc. A predetermined time interval can be chosen in which the pulse history is monitored with regard to their number, voltage levels, period lengths and other characteristics. The polarity switches can then be implemented based on the history. E.g. it can be implemented such that equal numbers of pulses of different polarity are present within the predetermined interval.

Many other sequences can be used implementing the inversion driving principle at least once over a chosen time interval which ultimately may be the lifetime of a device, but preferably is shorter.

In the above examples, it was assumed that pulse duration and absolute signal level were identical. In real life situations such may not always be practical as different actuations may be needed. Thus, for example a first actuation may need to be different from a second actuation to be achieved with different drive signal levels, e.g. to attain different actuation levels etc. Again simple inversion of voltage polarity will have its effect. Thus even if in FIGS. 4A to 4D the pulses 45 would have had different absolute signal levels than pulses 46, the inversion will improve drift compared to any driving without the inversion.

Figure 4E:
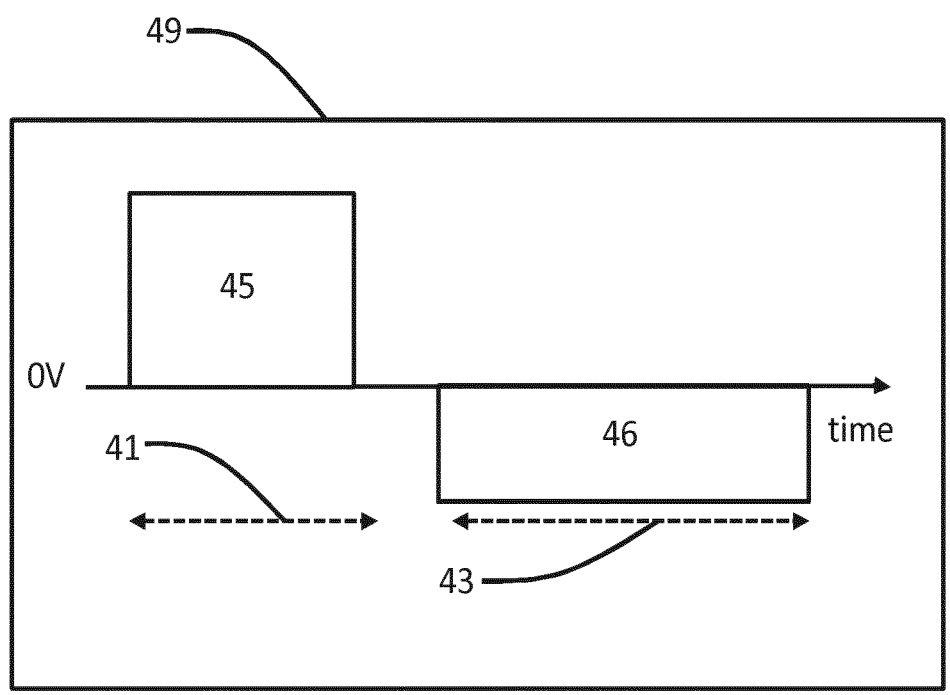

However, in case voltages of different actuations need to be different, a further improvement can be gained by also adjusting the pulse durations. This makes use of the hereinabove explained principle of charge movement or other relaxation effects being dependent not only on signal level, but also signal duration. Thus, the drive signal 49 of FIG. 4E shows pulse 45 with first period 41 shorter than second period 43 of pulse 46. To compensate for the difference in period, the voltage level of period 46 is chosen lower than that of pulse 45.

The polarity inversions may be performed after predetermined time intervals. For example, the inversion time may be less than that required for charges to move from one side of the EAP layer to the other which may happen if EAP layers are thin as with the EAP because drive voltages scale with this layer thickness. In this way, drive voltages can be kept relatively low (because of low thickness of EAP) while the maximum charge separation distance may be reduced and maintained below the thickness dimension of the device. This is especially useful if inversion is used during a single actuation event.

In a more general form of compensation, the pulses are chosen and organized such that the area under the voltage time curve of pulses of one polarity within a certain time period matches the area under the voltage time curve of pulses of the other polarity during the same time period. This effect may improve within a given period of time with increased balancing of the integral of drive signal level (absolute value of voltage differences) for the opposing voltage differences over their respective durations within that period. Such integral can be done using at least a pair of actuation signals of opposing polarity (e.g. a pair of pulses 45 and 46 in FIGS. 4A to 4E) or it can be done per (predetermined) time interval.

The polarity reversal reverses the motion of charged or polar species, whereby the amount of charge build-up or internal field buildup is—at least to an extent—reduced.

The time period between inversion of the voltages and therewith the electric field may be substantially shorter than the lifetime of the device. For example, there may a set number of actuations before each polarity change.

In the above examples there was time for the actuation structure to relax to its non-actuated state between separate actuations. This relaxation occurs due to the fact that if the voltage difference reduces to zero, so will the charges on the electrodes, the associated electric field between them and through the EAP material and hence the corresponding actuation. However, due to time delays of the actuation response, the actuator may not in all situations relax back fully to its 'off' state, i.e. its non-mechanically actuated state or non-driven state. The amount of relaxation will be dependent on the rate of mechanical relaxation (mechanical relaxation time constant) and the time given for relaxation (determined by the electrical time constant). The latter is dependent on the rate of change of the electric field, i.e. of charge (i.e. rate of voltage change (or rate of current change) and impedance of the system. This difference in mechanical and electrical relaxation constants may be exploited with the invention.

The rate of charge change (refresh rate) and rate of inversion of the voltage polarity may thus be chosen (through electrical design based on impedance) to be fast enough so that relaxation of the mechanical actuation state is not complete, very little or even absent during switching of voltage difference polarity (e.g. upon going from pulse 45 to pulse 46 etc.).

Thus, while the examples of FIGS. 4A to E make use of polarity inversion between separate actuation events, i.e. between those of the first time interval and of the second time interval, and there may be short (almost zero time) and long periods of rest between successive actuation events (thus between opposite polarity pulses), it is also possible to apply inversion during the course of a single actuation event. This would in fact correspond with a situation in which pulse inversion is so fast that the mechanical relaxation of the EAP structure cannot, or not completely follow the inversion, such that the actuation state substantially remains the same within the first period and the second period, or at least does not revert to zero actuation.

An advantage of this is that compensations provided by the invention can be performed in one and the same actuation event so that for compensation no pairing and tracking of historic actuations need be done as was described in relation to the examples of FIGS. 4A to E described hereinbefore.

For example, the zero voltage time between the actual pulses may be zero and/or pulse flanks may be steep. The driver and/or electrode structure in combination with EAP structure (electrical capacitance and/or resistance) may be adjusted according to general electrical theory for that. Then, reversal of voltage may be completed while relaxation of the actuation achieved within the first time period has not substantially or entirely changed when the second time period starts. Preferably, actuation changes of less than 50%, 20%, 10%, 5%, 2%, 1%, or 0% are achieved with this method. Hence one mechanical actuation state can be maintained with an alternating signal drive scheme. This effect is of course assisted if the electric field strength (and thus if Voltage magnitude at constant EAP layer thickness) is the same for both voltage polarities, so the same actuation voltage level is provided at the two opposing polarities. This also limits vibrations due to the polarity reversals.

Exemplifying drive schemes are shown by the drive signals of FIGS. 5A to D when used with e.g. the device of FIG. 3. Within one period 57 of continuous actuation (continuous actuation period), there is a pulse 55 with a first period 51 and a pulse 56 within period 53 where these pulses have inverted polarity. The pulses follow each other so quickly that the mechanical actuation upon inversion is not disturbed (or at least not reverting to zero).

Figure 5A:
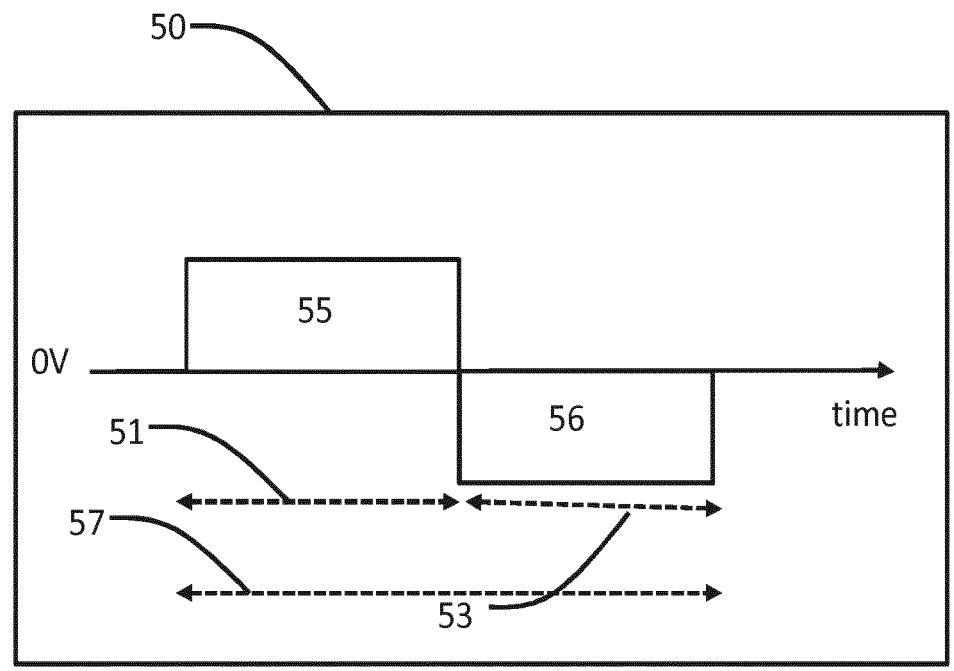
FIGS. 5A to 5D show drive schemes with voltage difference or signal inversion within single individual actuation events.
Figure 5B:
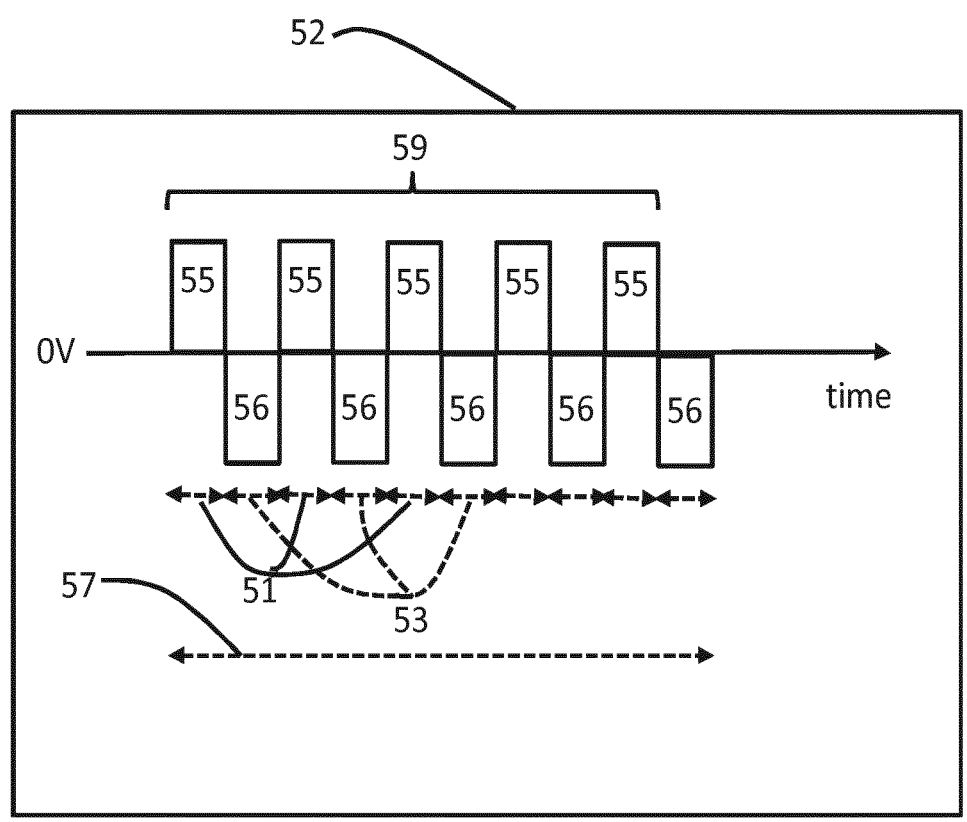
Figure 5C:
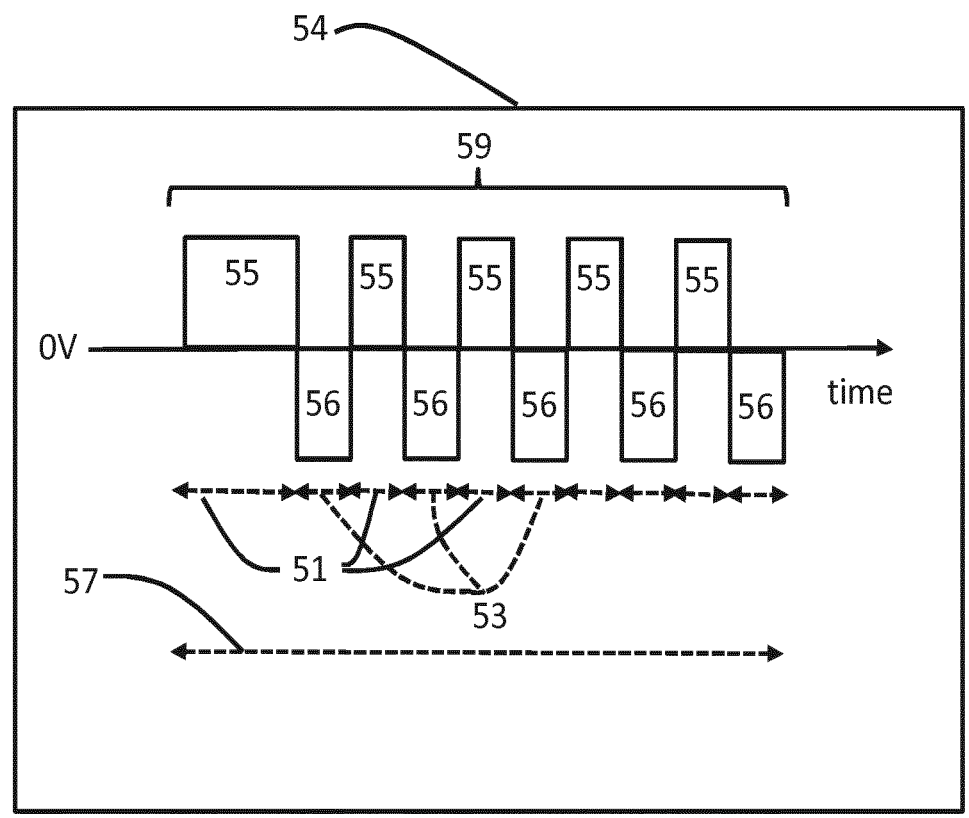

In the waveform 50 of FIG. 5A, drift will build during pulse 55 while it will be compensated during pulse 56. The buildup and accuracy of the compensation can be increased by shortening the periods and using multiple pulses 55 and/or 56. This is for example done with a drive scheme 52 of FIG. 5B. It shows an alternating voltage waveform within the time interval 57 comprising a plurality of pulses 55 with periods 51 and a plurality of pulses 56 with periods 53. There are as many pulses 55 as there are 56. Thus, with alternating voltage waveform a similar actuation can be achieved but with less absolute drift per first and second period.

In these cases and this is preferred, the pulses 55 and 56 are again equally large in terms of absolute level and duration as this will have the best compensating effect, but this need not be the case for the invention to have some effect.

As described, improved compensation can be achieved with alternating signals. Thus preferably, the pulses 55 and 56 (as also 55' and 56') are part of an alternating signal with multiple signal wavelengths in one actuation time interval (57 or 57') Hence in FIG. 5A only one wavelength of such alternating signal would be shown then. In the above cases each actuation then comprises an alternating signal applied to the electrodes such that the overall voltage difference between the electrodes alternates. The charge separation is thereby further reduced and there may be substantially zero charge separation or other defect at the end of each actuation period (each single actuation event).

Thus, if the mechanical actuation is to be disturbed as less as possible, then the driving can be achieved by driving the actuator with an alternating drive signal with an inversion frequency substantially faster than the speed of mechanical actuation of the device. As typical EAP actuators can be mechanically actuated from static to quasistatic up to kHz range (although at limited amplitude), suitable drive signal inversion frequencies will be at least 2 times this frequency and more preferably even higher (e.g. 5, 10, 50, 100 or even 500 times higher).

In such cases when the actuator needs to actuate from its equilibrium (non-driven) position to an actuation state, first a drive signal can be provided that has a frequency slow enough (may be DC) to have the actuator mechanically deform. If the desired deformation (actuation) is reached, the slow frequency signal is changed into a fast frequency signal with the same amplitude as the slow signal such that with the fast frequency the actuator cannot to relax while it suitably suppresses the side effect of prolonged actuation. An exemplifying drive scheme 54 is shown in FIG. 4C. The first pulse 55 is longer than other pulses and this pulse may be used as the quasistatic pulse. Its length and/or amplitude can be adjusted to reach a specific actuation state that is subsequently maintained by the remainder of the scheme 54 that is the alternating pulses 55 and 56.

The number of positive and negative pulses within each actuation signal is preferably equal (or at least closely equal) and this is made easier by increasing the driving frequency. Again integration of areas under a curve may be used to control balance of positive and negative polarities.

Driving frequencies can be calibrated by measuring the mechanical actuation output as a function of waveform shape (square wave, sinusoidal, triangular or other), amplitudes and/or driving frequencies and storing one or more of these parameters for a specific mechanical actuation output to be reached. A lookup table approach can then be used to select an appropriate driving signal for generating a desired mechanical actuation output.

The alternating signal preferably has the form of a square wave, as this gives the least deformation when the polarity changes (upon inversion). But other shapes such as sinusoidal or triangular or mixed shapes may be used. The alternating signals can have constant amplitude or changing amplitude during actuation.

In any of the above cases, compensation in waveforms of FIGS. 5A to 5D is achieved within one actuation event. This allows that mutually different actuation events can be used each one being self-compensating. No tracking or minimal tracking of pulse history is in principle required to optimize any compensation.

Figure 5D:
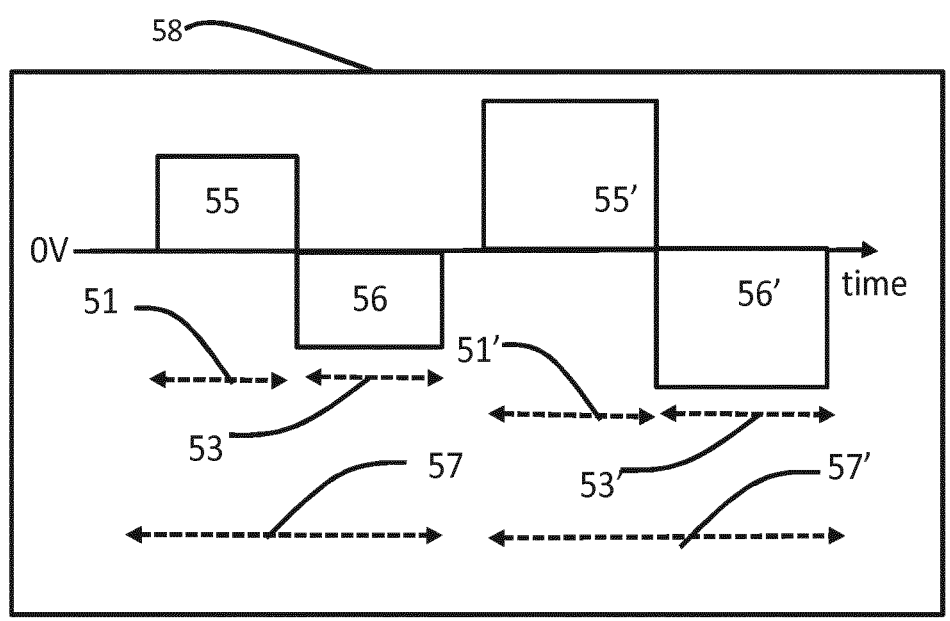

FIG. 5D shows two consecutive separate actuation events one with actuation period 57 and one with actuation period 57'. Between them is a rest period (not shown) similar to the rest period 47 of FIG. 4A. Each of the actuation events uses self-compensation by inverting the voltage polarity at least once. Thus, without the loss of compensating effect, the time interval 57' may now be chosen different from that of 57. Also the amplitude of the pulses may be different for pulses 55 and 55'. Hence completely individual and independent actuations can be performed with almost full compensation of disadvantageous effects as the compensation occurs during each individual actuation. Again an alternating waveform using plurality of pulses 55 and 56 per drive period can be used as was described with reference to FIG. 5B.

When using field inversion during the course of a single actuation of the device, it is possible to use adjusted devices to improve the mechanical output stabilization of a device. Thus, if a particular polymer has a delay in the actuation response following the electrical signal, so that it cannot follow the e.g. square wave signal of waveforms, there will be an undesired deformation when the polarity changes. This undesired deformation can be minimized by using somewhat adjusted actuation devices.

Figure 6A:
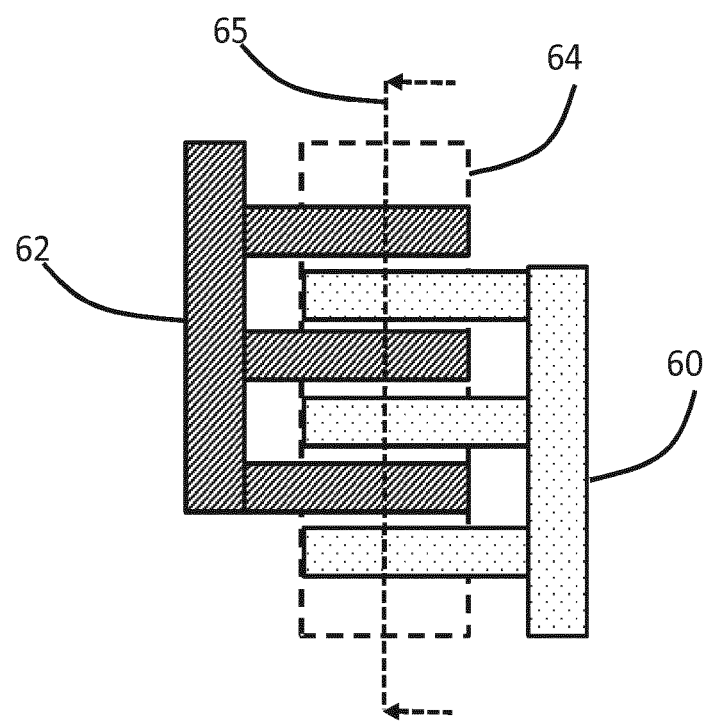
FIGS. 6A and 6B respectively show a top view and a cross sectional view perpendicular to and at the location of line 65 of an electroactive polymer structure with an alternative electrode layout.
Figure 6B:
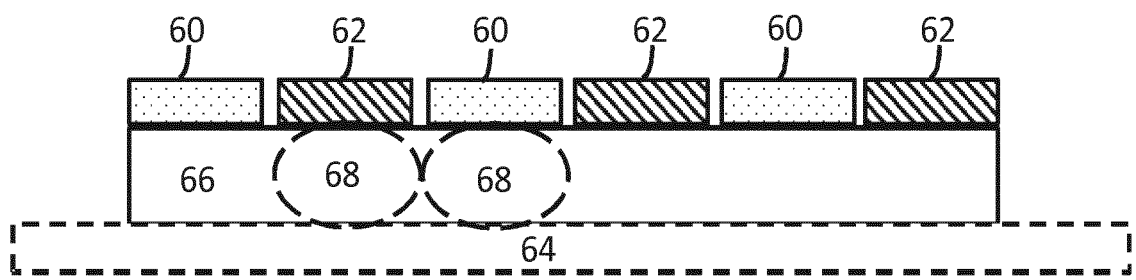

One way is to use a device with segmented electrodes as shown in FIGS. 6A and 6B in combination with out of phase driving of the segmented electrodes. FIG. 6A shows a top view of an EAP structure comprising two interleaved comb electrodes 60, 62 as electrode segments. For example, the electrode 12 of the device of FIG. 3 may be such an interleaved comb electrode in that it comprises the segments 60 and 62. The grounded electrode 64 (electrode 10 in FIG. 3) is underneath the interleaved electrodes 60 and 62 and also on the other side of the EAP material layer 66 (which is not shown for clarity in FIG. 6A). Thus in FIG. 3 the electrode 64 can be represented by the single shared electrode 10. Alternatively, there may be corresponding electrodes on each side of the EAP layer in which case also electrode 64 would be segmented (interleaved) (e.g. both the electrodes 10 and 12 in FIG. 3 can be segmented. Using the segmented electrode(s) abutting parts 68 (only two shown for clarity) of the EAP material are covered with interleaved parts of the comb electrode(s).

The segmented electrodes are preferably much smaller than the total area of the electrode and are evenly and uniformly distributed over the total actuator area. However, depending on design needs all sorts of other patterned repetitive shaped electrodes can be used also.

The device may now have a driver that is capable of providing electrical drive signals according to the invention to each one of the different segments. These electrical driving signals may then be provided to the different segments such that the driving voltage polarity switching may be made out of phase between the segments, namely with one driven to one polarity while the other is driven to an opposite polarity at least part of the time.

Figure 6C:
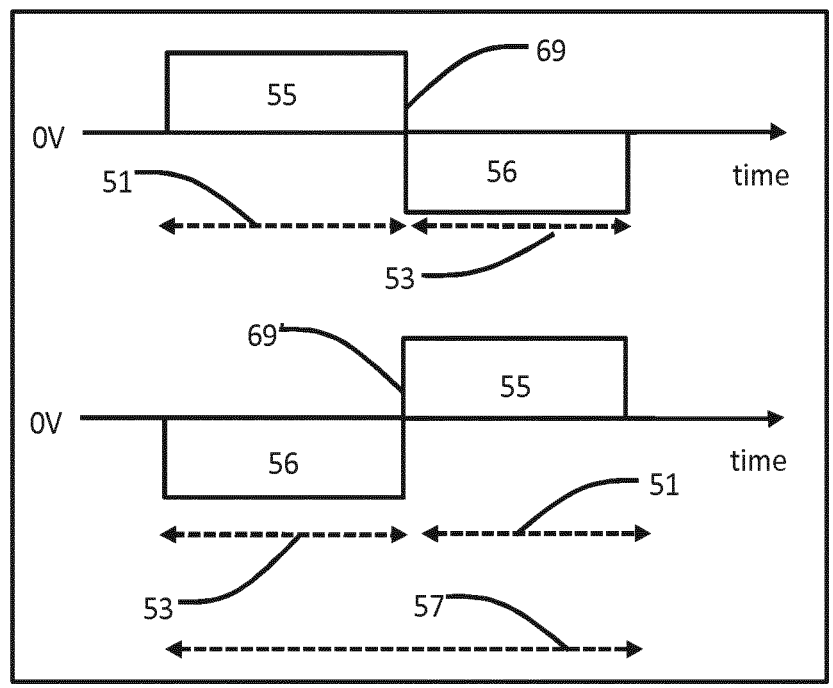
FIGS. 6C to 6E show drive schemes for separate ones of electrical drive signals in which switching between voltage difference polarities is out of phase.

A first exemplifying drive scheme is provided in FIG. 6C where during a continuous actuation drive period 57, the upper signal trace represents the electrical drive signal provided to the first segment 60, while the lower signal trace represents another electrical drive signal provided to the second segment 62. The switching is such that while one segment switches from first to second polarity, the other segment switches from second to first. The signal levels and durations in the different traces (for the different segments) may be the same (giving improved stability) or different (for changing the actuation state).

In the FIG. 6C the switching for both segments is in phase, but the voltage polarity over the portions 68 of segment 60 and 62 is out of phase.

Figure 6D:
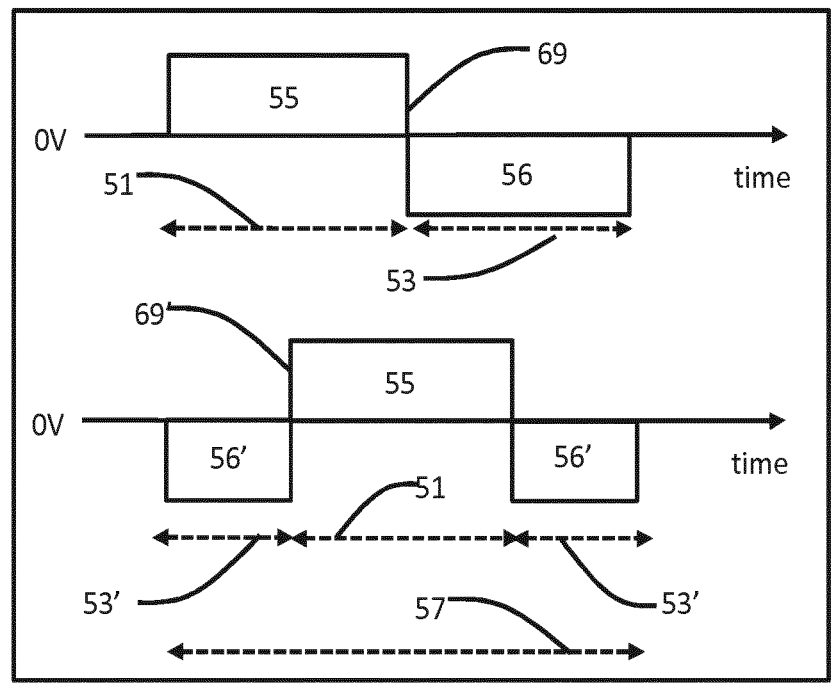

In the drive signal scheme of FIG. 6D, the switchings for the different segments (in upper trace 69 and lower trace 69) are not done at the same time instances (out of phase) such that while one segment is kept at a voltage difference, the other is switched. In this case switching of one trace is halfway through a pulse of the other trace. However, other out of phase relations can be used. Note that integral of signal over time is the same in both signal traces. This scheme can be used to reduce loss of actuation during switching and hence to reduce mechanical vibrations further during the switchings or to provide a more constant actuation level.

Figure 6E:
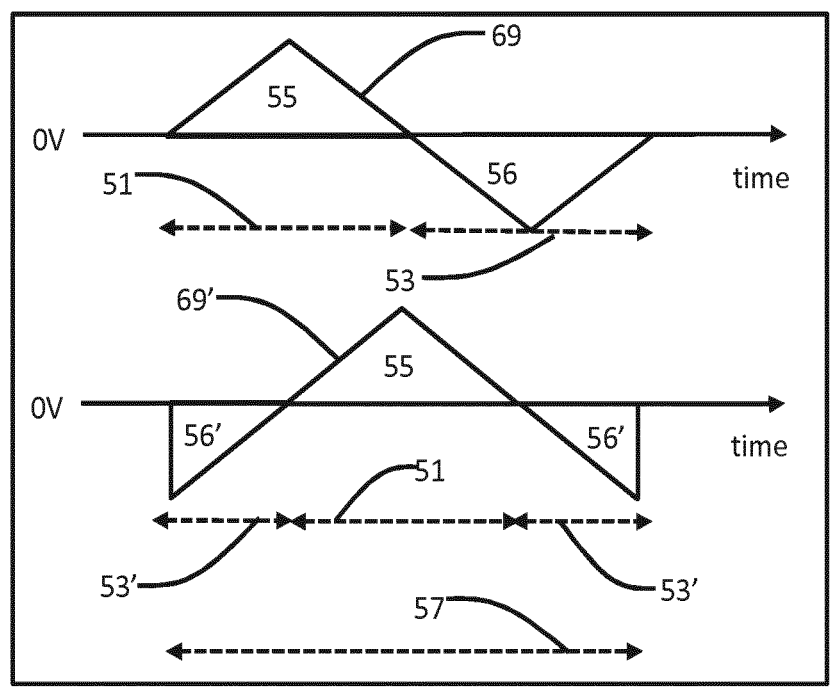

FIG. 6E shows yet another way of implementing the out of phase driving. In this case any actuation level can be kept equal during the entire period 57 as the resultant of levels of both traces at any particular time instance is the same. In this case the drive signals (in each of the upper and lower traces are triangular traces. In this respect the drive signals may have a waveform that is a continuous function with a continuous first derivative. An example may be a sinusoidal triangular waveform where one segment drive signal switches while the other is at maximum level. With such signal overlap in time, when amplitudes of such waveforms are equal for the two segments, even better reduction of vibration or even more constant mechanical output level can be obtained.

It is noted that the examples of FIG. 6 show only one voltage difference polarity switching per period 57, but again as explained herein before the signals can be alternating to provide multiple of such switchings per period 57. Frequencies can be adjusted as indicated hereinabove.

Figure 6F:
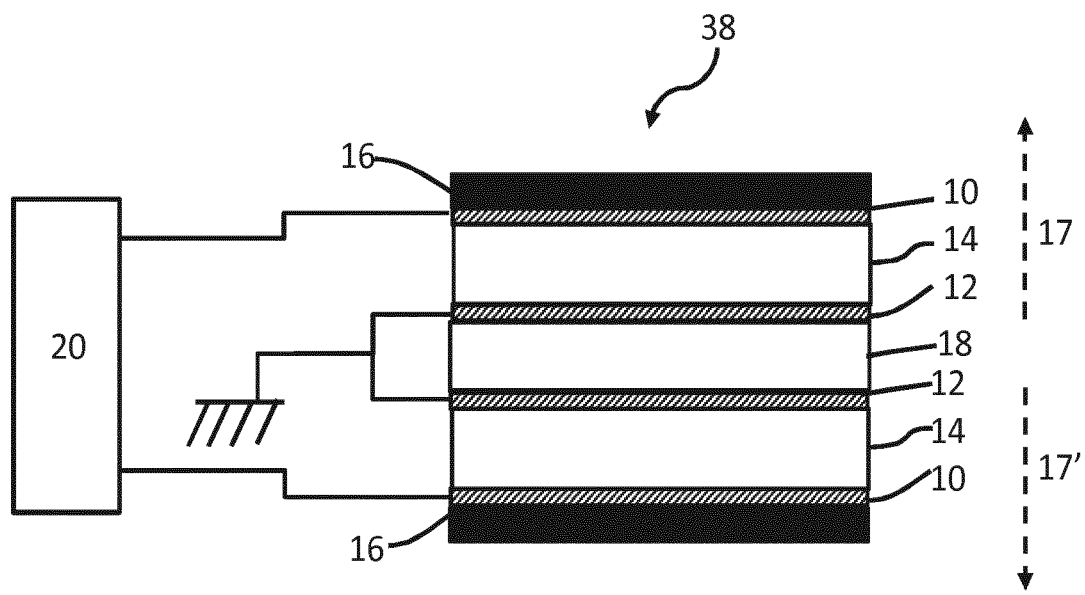
FIG. 6F shows an actuator device having two separate units each having an electrode arrangement and an electroactive polymer structure, where the actuations of both units contribute to one single device actuation output.

While the out of phase driving of the segments works to achieve signal inversion with reduced mechanical output disturbance, such reduced disturbance can also be obtained with a device having two separate electroactive polymer structures with their corresponding electrodes, where these structures both contribute to the same mechanical output when they are driven out of phase in a similar way as the segments of the device of FIGS. 6A and B. In FIG. 6F such an alternative device is shown. Parts with reference numerals also described in FIG. 2 or 3 are the same as in the latter figures. Thus, the device of FIG. 6F includes two bending actuator units each built as described for FIG. 2. Each bending actuator unit thus comprises a stack including EAP material 14 between electrodes 10 and 12 laminated to carrier body 16. Between the stacks is isolating material 18 to which the stacks are not attached but with which they are in mechanical contact. The driver 20 provides electrical signals to electrodes 10 while the electrodes 12 are grounded.

When driven, the top bending actuator stack bends with its outer (left and right in the plane of drawing) sides in direction 17 while the bottom bending actuator stack bends with its outer sides in direction 17'. Hence the mechanical actuations can reinforce or support each other via the layer 18 in order to contribute to the device actuation output. The whole stack assembly can be arranged in a holder with the bottom of the stack assembly placed on the bottom of the holder and the surface 38 for providing the device actuation output.

The device of FIG. 6F may be driven as explained for the segmented electrode device where the different electrical derive signals provided to the segmented electrodes are instead now supplied to the different electrodes 12 of the different actuator units. Hence, actuation relaxation of one unit during switching may be compensated by increased actuation by the other unit and vice versa. This principle of driving can of course be used for a device having a multiplicity of such independently addressable actuator units.

The case of FIG. 6F shows stacked bending actuators, but these may also be parallel supporting one actuation output member. Also another actuator structures/units can be used, such as ones that provide expansion (see e.g. actuator of FIG. 1) instead of, or in addition to bending actuators.

In all examples above, the integral of the electric field or voltages over time used for providing such field for the two opposite polarity signals may controlled to be of equal magnitude (absolute value). This gives the possibility of obtaining a long term neutral motion of charges while actuating.

Instead of the direct connection between the driver and the actuator electrodes as shown in FIGS. 3 and 6A or F, the voltage can be inverted by using a physical or electronical switch, whereby the connections of a single voltage source (such as a battery) are periodically attached to opposite electrodes e.g. the electrodes 10 and 12. This enables a signal generator to be used that only needs to generate one polarity voltage pulses.

FIGS. 3 and 6A or F instead show one of the electrodes of the actuator being driven with at least two output levels of opposite polarity compared to the voltage applied to the other electrode of the actuator. For simplicity, if the first electrode is driven at 0V as shown, the output levels for the second electrode 12 are positive and negative.

The invention requires that the signals applied to the electrodes between which a voltage difference is generated are such that the voltage difference is inverted according to the above principles. In FIG. 3 or 6 A or F only the signal applied to one electrode alternates to this end while the other electrode is at ground. The reference level ground may also be a different reference level. For example it may be a finite positive voltage. Then drive signal on the other electrode can be designed such that the desired voltage difference polarities occur on the electrodes. This may also be done using alternating signals on both electrodes between which the voltage difference is generated.

The opposite polarity output levels may be of identical magnitude as schematically shown in FIG. 3. This has the advantage that the actuator will be equally actuated by the two output levels.

The device of FIG. 6A or F may have a phase shifter coupled between the output of the driver and one of the segments or actuation units. Hence the electrical drive signals provided between segments or units will only be shifted in time while no separate signal generation is needed.

In order to create the same time integral of the voltage/electric field in the two directions (polarities), when performing inversion using a physical switch operated by the driver, the driver can have means to clock the switch times, i.e. equal integral fields are achieved by ensuring that the switch is held for equally long in one setting as in the other setting. When the voltage inversion is implemented within the driver, equal integral fields may be achieved by ensuring that the sum of (driver voltage)×(voltage pulse length) is equal for both positive and negative voltages (assuming for simplicity that the second electrode is at 0V). Note that there are many ways to ensure that the sum is equal, depending upon the number of driver voltages which are available from the driver.

Indeed, instead of the two level signals shown in the Figs. above, the driver may have a plurality of output levels, with at least two of opposite polarity compared to the voltage applied to the first electrode of the actuator. In this way, a number of actuator deformations may be achieved. Again, many or all of the output levels of opposite polarity may be of identical magnitude. This has the advantage that the actuator will be equally actuated by output levels with the same amplitude but opposite polarity.

The electrode arrangement may comprise electrodes on opposite faces of the electroactive polymer layer as shown above in FIG. 3. These provide a transverse electric field for controlling the thickness of the EAP layer. This in turn causes expansion or contraction of the EAP layer in the plane of the layer (FIG. 1), which in case a substrate connected to the layer stack is used (FIG. 2) curvature of the actuator.

The electrode arrangement may instead comprise a pair of comb electrodes on one face of the electroactive polymer layer. This provides in-plane electric field, for directly controlling the dimensions of the layer in-plane. The inversion schemes described above may also be applied with good effect.

The examples above make use of an electroactive polymer layer which is actuated to make it expand (see FIGS. 1 and 3 for example), and this may typically be translated into a bending movement with e.g. a construction as depicted in FIG. 2. However, other types of movement may also be induced depending on construction of an actuation member. The invention will have effect for any of the constructions.

The invention can be used for devices that provide bistable actuation, i.e those that maintain actuation states without presence of a driving signal as even in these devices actuation needs to take place to drive them into such a bistable maintainable state and during driving polarity reversal can be implemented.

Figure 7:
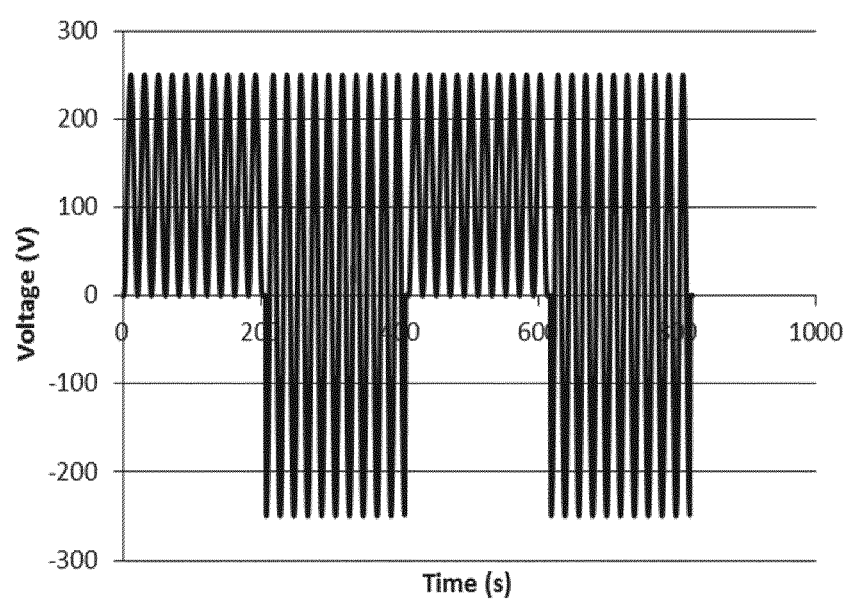
FIG. 7 shows a driving waveform applied as an experimental demonstration of the effect of using a bipolar (first and second polarity signals) drive waveform compared to a unipolar (only one polarity voltage difference) drive waveform.

The effect on the performance of an actuator by using the bipolar driving scheme has been determined by experiment. The displacement of the actuator is measured as a function of the voltage applied (with a constant external load applied to the actuator) during a unipolar drive scheme and during a bipolar drive scheme. FIG. 7 shows the driving waveform applied. It comprises four cycles of 200 s each in sequence. The first cycle is 10 periods of a unipolar drive waveform with an amplitude of 250V. The second cycle is 10 periods of a bipolar drive waveform also with an amplitude of 250V. The third cycle is 10 periods of a unipolar drive waveform and the fourth cycle is 10 periods of a bipolar drive waveform.

Figure 8:
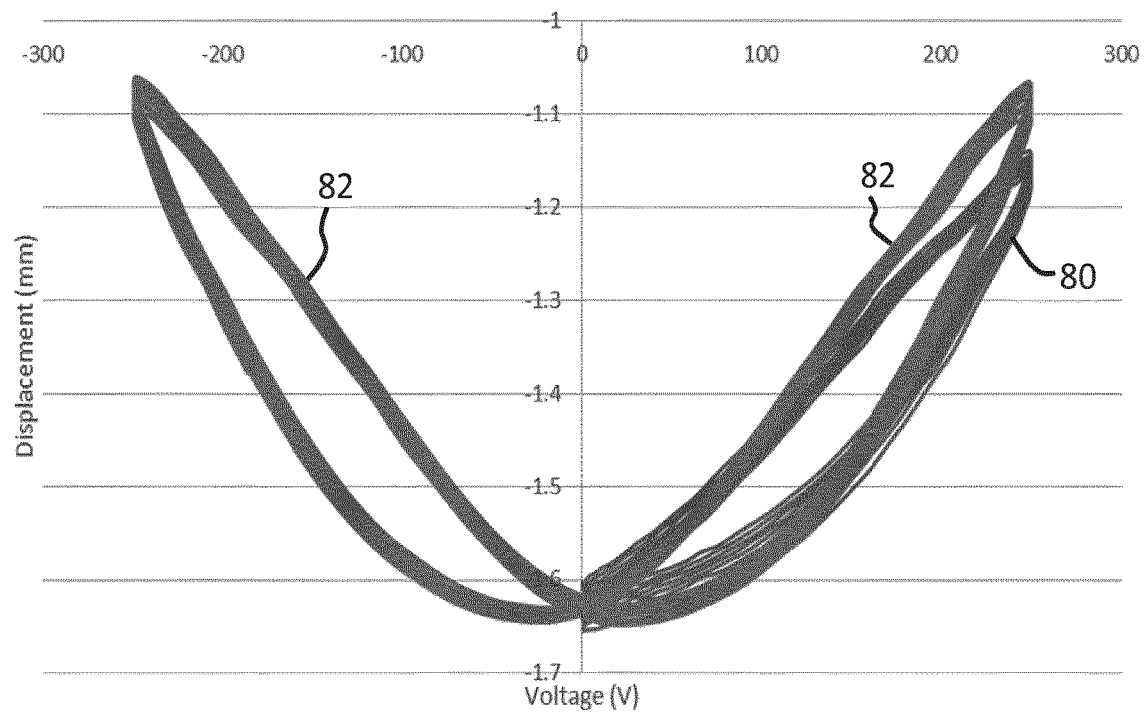
FIG. 8 compares the first 10 cycles of unipolar (only one polarity voltage difference) driving with the following 10 cycles of bipolar (first and second polarity signals) driving.

FIG. 8 shows the displacement (y-axis) as a function of the drive voltage applied (x-axis). Negative displacement corresponds to upward bending of a bending actuator.

FIG. 8 shows the results for the first two cycles of 10 periods of unipolar driving cycles (plot 80) and 10 periods of bipolar driving (plot 82) cycles as shown in FIG. 7. The unipolar driving 80 appears only on the positive voltage part of the x-axis. The bipolar driving 82 gives the same displacement function for the opposite polarities (right and left Voltage axis displacement is substantially the same.

FIG. 8 also shows that the bipolar drive scheme advantageously gives approximately 15% more displacement (−1.07 mm to −1.65 mm compared to −1.15 mm to −1.65 mm) compared to the displacement caused by the unipolar drive scheme.

Figure 9:
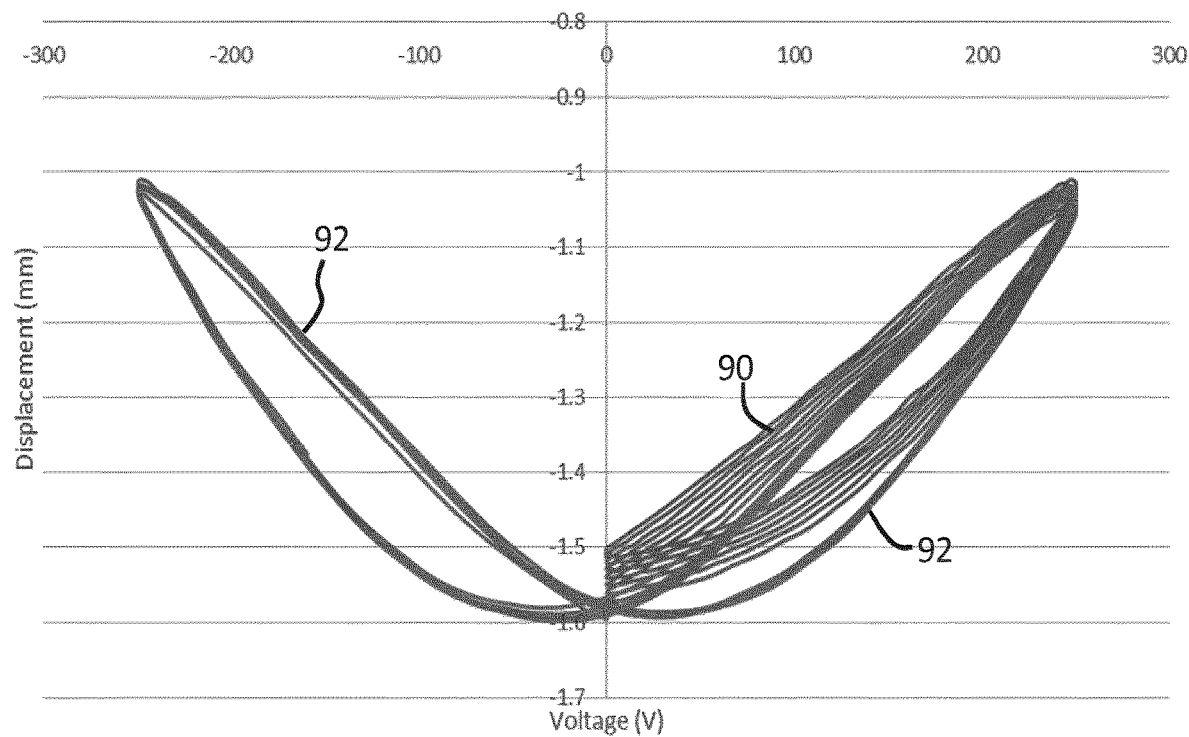
FIG. 9 compares the next 10 cycles of unipolar (only one polarity voltage difference) driving with the following 10 cycles of bipolar first and second polarity signals) driving.

FIG. 9 shows the results for the last two cycles, i.e. the third 10 periods of unipolar driving (plot 90) and the fourth 10 periods of bipolar driving (plot 92) as shown in FIG. 7.

This graph shows the drift of the displacement curve upward and the maximum displacement attainable with the actuator seems to diminish for the unipolar driving scheme. Thus, the bipolar driving scheme also gives more reproducible results when compared to the unipolar driving scheme. At 0 Volt driving (rest state of the actuator device) a drift in displacement is observed for the unipolar driving scheme while this is not present or largely suppressed by using the bipolar driving scheme. Hence, the bipolar driving scheme gives a better and more reproducible return to rest state of the actuator.

This deteriorated response in the case of unipolar driving results from the drift of free charges to one electrode, which shields the electrical field. Also, with unipolar driving, crystallite domains can become trapped resulting in poor relaxation, therefore not contributing to the displacement of the actuator.

This invention relates in particular to actuation of EAP actuators comprising EAP as part of an EAP structure. The EAP structure thus comprises an EAP material. This is a material that can make the EAP structure deform upon providing an electrical signal to the EAP structure. As such the EAP material can be a mixture (homogeneous or heterogeneous) comprising or consisting of one or more matrix materials with one or more EAPs. This can for example be an EAP dispersion in a further polymer matrix material. The further polymer matrix material can be a network polymer that allows deformation invoked by the EAP mixed in or dispersed within the matrix network. The EAP material can be dispersed in it. Elastic materials are examples of such networks. Preferably the amount of EAP in such composite EAP materials is chosen from the group consisting of >50 weight or mole percent, >75 weight or mole percent or >90 weight or mole percent. EAP materials can also comprise polymers that contain in their molecules parts of EAPs (or EAP active groups) and parts of inactive other polymers. Many electroactive polymers can be used a number of which will be described below. However, The EAPs to be used must provide a symmetric actuation, i.e. an actuation for which the direction of actuation is independent of the direction of electric field (in other words polarity of voltages applied to the electrodes for generating the electric field).

Within the subclass of field driven EAPs, a first notable subclass of field driven EAPs are Electrostrictive polymers. While the electromechanical performance of traditional piezoelectric polymers is limited, a breakthrough in improving this performance has led to relaxor polymers such as (P)VDF based relaxor polymers, which show electric polarization (field driven alignment) and hence symmetric actuation response. These materials can be pre-strained for improved performance in the strained direction (pre-strain leads to better molecular alignment). Another subclass of field driven EAPs is that of Dielectric Elastomers.

A thin film of such materials may be sandwiched between compliant electrodes, forming a capacitor such as a parallel plate capacitor. In the case of dielectric elastomers, the Maxwell stress induced by the applied electric field results in a stress on the film, causing it to contract in thickness and expand in area. Strain performance is typically enlarged by pre-straining the elastomer (requiring a frame to hold the pre-strain). Strains can be considerable (10-300%). For this class of dielectric elastomer materials, electrodes are preferably mechanically attached either directly or with intermediate material layers to the EAP material.

For the first subclass of materials normally thin film metal electrodes are used since strains usually are in the moderate regime (1-5%), also other types of electrodes, such as e.g. conducting polymers, carbon black based oils, gels or elastomers, etc. can also be used. For the second class of materials typically type of electrode materials is constrained by the high strains. Thus for dielectric materials with low and moderate strains, metal electrodes and conducting polymer electrodes can be considered, for the high-strain regime, carbon black based oils, gels or elastomers are typically used.

In relation to the above materials and with more detail, electro-active polymers classes suitable for this invention thus can include, but are not limited to, the sub-classes: electromechanical polymers, relaxor ferroelectric polymers, electrostrictive polymers, dielectric elastomers.

The sub-class electrostrictive polymers includes, but is not limited to: Polyvinylidene fluoride (PVDF), Polyvinylidene fluoride-trifluoroethylene (PVDF-TrFE), Polyvinylidene fluoride-trifluoroethylene-chlorofluoroethylene (PVDF-TrFE-CFE), Polyvinylidene fluoride-trifluoroethylene-chlorotrifluoroethylene) (PVDF-TrFE-CTFE), Polyvinylidene fluoride-hexafluoropropylene (PVDF-HFP), polyurethanes or blends thereof.

The sub-class dielectric elastomers includes, but is not limited to: acrylates, polyurethanes, polysilanes or silicones.

The electrodes of the EAP structure can have many configurations each with specific advantages and effects.

If the plated electrodes are arranged in a non-symmetric configuration, the imposed signals (e.g. voltage) can induce all kinds of deformations such as twisting, rolling, torsioning, turning, and non-symmetric bending deformation of the EAP structure.

In all of these examples, additional passive layers may be provided for influencing the electrical and/or mechanical behavior of the EAP material layer in response to an applied electric field or current.

The EAP material layer of each unit may be sandwiched between electrodes. Alternatively, electrodes can be on a same side of the EAP material. In either case, electrodes can be physically attached to the EAP material either directly without any (passive) layers in between, or indirectly with additional (passive) layers in between. But this need not always be the case. For relaxor or permanent piezoelectric or ferroelectric EAPs, direct contact is not necessary. In the latter case electrodes in the vicinity of the EAPs suffices as long as the electrodes can provide an electric field to the EAPs, the Electroactive polymer structure will have its actuation function. The electrodes may be stretchable so that they follow the deformation of the EAP material layer. Materials suitable for the electrodes are also known, and may for example be selected from the group consisting of thin metal films, such as gold, copper, or aluminum or organic conductors such as carbon black, carbon nanotubes, graphene, poly-aniline (PANI), poly(3,4-ethylenedioxythiophene) (PEDOT), e.g. poly(3,4-ethylenedioxythiophene) poly(styrenesulfonate) (PEDOT:PSS). Metalized polyester films may also be used, such as metalized polyethylene terephthalate (PET), for example using an aluminum coating.

The materials for the different layers will be selected for example taking account of the elastic moduli (Young's moduli) of the different layers.

Additional layers to those discussed above may be used to adapt the electrical or mechanical behavior of the device, such as additional polymer layers.

The device may be used as a single actuator, or else there may be a line or array of the devices, for example to provide control of a 2D or 3D contour.

The invention can be applied in many EAP applications, including examples where a passive matrix array of actuators is of interest, in particular as a result of the threshold function described above for some actuator examples.

In many applications the main function of the product relies on the (local) manipulation of human tissue, or the actuation of tissue contacting interfaces. In such applications EAP actuators provide unique benefits mainly because of the small form factor, the flexibility and the high energy density. Hence EAP's can be easily integrated in soft, 3D-shaped and/or miniature products and interfaces. Examples of such applications are:

Skin cosmetic treatments such as skin actuation devices in the form of EAP-based skin patches which apply a constant or cyclic stretch to the skin in order to tension the skin or to reduce wrinkles;

Respiratory devices with a patient interface mask which has an EAP-based active cushion or seal, to provide an alternating normal pressure to the skin which reduces or prevents facial red marks;

Electric shavers with an adaptive shaving head. The height of the skin contacting surfaces can be adjusted using EAP actuators in order to influence the balance between closeness and irritation;

Oral cleaning devices such as an air floss with a dynamic nozzle actuator to improve the reach of the spray, especially in the spaces between the teeth. Alternatively, toothbrushes may be provided with activated tufts;

Consumer electronics devices or touch panels which provide local haptic feedback via an array of EAP transducers which is integrated in or near the user interface;

Catheters with a steerable tip to enable easy navigation in tortuous blood vessels.

Another category of relevant application which benefits from EAP actuators relates to the modification of light. Optical elements such as lenses, reflective surfaces, gratings etc. can be made adaptive by shape or position adaptation using EAP actuators. Here the benefits of EAPs are for example the lower power consumption.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

In summary, the invention provides an actuator device comprising an electroactive polymer (EAP) and a driver for generating a electrical drive signals which give opposite polarity voltages and thus electrical field within the electroactive polymer at different times. In this way, charge build-up can be reduced or avoided, while prolonged activation times are still possible. This improves the performance and/or lifetime of the device.

The invention claimed is:

1. A method of operating an actuator device comprising:
    an electrode arrangement, the electrode arrangement comprising:
        a first electrode; and
        a second electrode,
            wherein the electrode arrangement is arranged to receive an electrical drive signal,
            wherein the electrical drive signal causes a voltage difference, and
            wherein the voltage difference is between the first electrode and the second electrode; and
    an electroactive polymer structure arranged to provide an actuation in response to the voltage difference, wherein the actuation has a direction of actuation that is independent of a polarity of the voltage difference;
    the method comprising applying the electrical drive signal to the electrode arrangement,
        wherein the electrical drive signal comprises a first electrical drive signal and a second electrical drive signal,
        wherein the first electrical drive signal has a first polarity during a first period,
        wherein the second electrical drive signal has a second polarity during a second period,
        wherein the second period is different from the first period, and
        wherein the second polarity is different from the first polarity.

2. The method as claimed in claim 1, wherein an absolute value of an integral of the voltage difference over the first period and an absolute value of an integral of the voltage difference over the second period are the same.

3. The method as claimed in claim 1, wherein the first period and/or the second period are longer than 10 milliseconds.

4. The method as claimed in claim 1, wherein the first period and the second period are equally long.

5. The method as claimed in claim 1, wherein the first electrical drive signal and/or the second electrical drive signal have multiple different voltage levels.

6. The method as claimed in claim 1, wherein the voltage difference during the first period is constant and the voltage difference during the second period is constant.

7. The method as claimed in claim 1, wherein the actuation is a continuous actuation within a drive period, and wherein the drive period comprises one or more of the first periods and one or more of the second periods.

8. The method as claimed in claim 7, wherein the first electrical drive signal and the second electrical drive signal follow each other such that the actuation does not change by more than 50%.

9. The method as claimed in claim 7,
    wherein the electrical drive signal comprises a first plurality of first electrical drive signals and a second plurality of second electrical drive signals, and
    wherein the first plurality of first electrical drive signals and the second plurality of second electrical drive signals form an alternating signal.

10. The method as claimed in claim 1,
    wherein the actuation comprises a first continuous actuation and a second continuous actuation mutually separated by at least one rest period,
    wherein the first electrical drive signal contributes to the first continuous actuation, and
    wherein the second electrical drive signal contributes to the second continuous actuation.

11. The method as claimed in claim 10, wherein at least one, or a plurality of first electrical drive signals is followed by at least one, or a plurality of second electrical drive signals.

12. The method as claimed in claim 11, wherein the method comprises:
    determining a characteristic for at least one of the first electrical drive signals within a predetermined time interval,
    wherein the characteristic is one or more of, a number of said at least one of the first electrical drive signals within the predetermined time interval, at least one signal level, at least one first drive period, and at least one integral of the voltage difference over time; and
    adjusting one or more of the same characteristics for one or more of the second electrical drive signals based on one or more of the determined characteristics.

13. The method as claimed in claim 1, wherein an absolute value of the voltage difference in the first period and an absolute value of the voltage difference in the second period are constant.

14. An actuator device comprising:
    an electrode arrangement, the electrode arrangement comprising:
        a first electrode; and
        a second electrode,
            wherein the electrode arrangement is arranged to receive an electrical drive signal,
            wherein the electrical drive signal causes a voltage difference, and
            wherein the voltage difference is between the first electrode and the second electrode;
    an electroactive polymer structure arranged to provide an actuation in response to the voltage difference, wherein the actuation has a direction of actuation that is independent of a polarity of the voltage difference; and
    a driver arranged to apply the electrical drive signal to the electrode arrangement,
        wherein the electrical drive signal comprises a first electrical drive signal and a second electrical drive signal,
        wherein the first electrical drive signal has a first polarity during a first period,
        wherein the second electrical drive signal has a second polarity during a second period,
        wherein the second period is different from the first period, and
        wherein the second polarity is different from the first polarity.

15. The actuator device as claimed in claim 14, wherein the driver is arranged to switch the electrical drive signal from the first electrical drive signal to the second electrical drive signal or vice versa at least once within a continuous actuation drive period.

16. The actuator device as claimed in claim 15,
wherein at least the first electrode comprises a first electrode segment and a second electrode segment,
wherein the driver is arranged to provide the first electrical drive signal and the second electrical drive signal,
wherein the first electrode segment is arranged to receive the first electrical drive signal and the second electrode segment is arranged to receive the second electrical drive signal, and
wherein the driver is arranged to cause the voltage difference at different portions of the electroactive polymer structure.

17. The actuator device as claimed in claim 16, further comprising an actuation unit, the actuation unit comprising the electrode arrangement and the electroactive polymer structure,
wherein the actuator device comprises at least two actuation units,
wherein each actuation unit contributes its actuation to the same actuation output of the actuator device,
wherein the driver is arranged to provide the first electrical drive signal and the second electrical drive signal, and
wherein the first electrode segment is arranged to receive the first electrical drive signal and the second electrode segment is arranged to receive the second electrical drive signal.

18. The actuator device as claimed in claim 16, wherein the driver is arranged to provide the first electrical drive signal and the second electrical drive signal such that the switching from the first electrical drive signal to the second electrical drive signal is out of phase.

19. The actuator device as claimed in claim 14, wherein the driver is arranged to switch the first electrical drive signal to the second electrical drive signal between continuous actuation drive periods after one or more first electrical drive signals, and/or after one or more second electrical drive signals.

20. The actuator device as claimed in claim 14, wherein the driver comprises an electrical power source arrange to generate electrical signals of the first polarity and of the second polarity.

* * * * *